United States Patent

Kojima et al.

[11] Patent Number: 5,939,230
[45] Date of Patent: Aug. 17, 1999

[54] LIGHT RECEIVING MEMBER

[75] Inventors: Satoshi Kojima, Kyoto-fu; Hiroaki Niino, Nara; Shinji Tsuchida, Kyoto-fu, all of Japan

[73] Assignee: Canon Kabushiki Kaisha, Tokyo, Japan

[21] Appl. No.: 08/862,351

[22] Filed: May 23, 1997

[30] Foreign Application Priority Data

May 23, 1996 [JP] Japan .................................. 8-128077

[51] Int. Cl.⁶ .................................................. G03G 5/085
[52] U.S. Cl. ................... 430/57; 430/56; 430/65; 430/66
[58] Field of Search ................... 430/56, 57, 65, 430/66; 136/258

[56] References Cited

U.S. PATENT DOCUMENTS

| | | | |
|---|---|---|---|
| 4,265,991 | 5/1981 | Hirai et al. | 430/64 |
| 4,650,736 | 3/1987 | Saitoh et al. | 430/57 |
| 4,696,844 | 9/1987 | Spector | 428/46 |
| 4,696,884 | 9/1987 | Saitoh et al. | 430/58 |
| 4,705,733 | 11/1987 | Saitoh et al. | 430/57 |
| 4,735,883 | 4/1988 | Honda et al. | 430/69 |
| 4,788,120 | 11/1988 | Shirai et al. | 430/66 |
| 4,886,723 | 12/1989 | Aoike et al. | 430/65 |
| 5,382,487 | 1/1995 | Fukuda et al. | 430/57 |
| 5,397,737 | 3/1995 | Mahan et al. | 437/101 |
| 5,455,138 | 10/1995 | Okamura et al. | 430/128 |
| 5,480,750 | 1/1996 | Kawada et al. | 430/31 |
| 5,516,611 | 5/1996 | Kojima et al. | 430/84 |
| 5,738,963 | 4/1998 | Niino | 430/57 |

FOREIGN PATENT DOCUMENTS

| | | |
|---|---|---|
| 679 955 | 11/1995 | European Pat. Off. . |
| 57-115556 | 7/1982 | Japan . |
| 58-21257 | 2/1983 | Japan . |
| 58-121042 | 7/1983 | Japan . |
| 59-143379 | 8/1984 | Japan . |
| 60-67951 | 4/1985 | Japan . |
| 60-95551 | 5/1985 | Japan . |
| 61-201481 | 9/1986 | Japan . |
| 62-83470 | 4/1987 | Japan . |

*Primary Examiner*—Christopher D. Rodee
*Attorney, Agent, or Firm*—Fitzpatrick, Cella Harper & Scinto

[57] ABSTRACT

A light receiving member comprising a photoconductive layer disposed on an electrically conductive surface of a substrate, said photoconductive layer being constituted by a non-single crystal material containing silicon atoms as a matrix and at least one kind of atoms selected from hydrogen atoms and halogen atoms, wherein said photoconductive layer contains a plurality of layer regions which are different from each other with respect to characteristic energy at an exponential tail obtained from a light absorption spectrum, hydrogen content and optical band gap. The light receiving member exhibits excellent potential characteristics and image-forming performance for visible laser.

13 Claims, 9 Drawing Sheets

CHARGE RETENTIVITY (when the second layer region is positioned on the surface side)

CHARGE RETENTIVITY (when the second layer region is positioned on the substrate side)

EXPOSURE MEMORY (when the second layer region is positioned on the surface side)

EXPOSURE MEMORY (when the second layer region is positioned on the substrate side)

ADHESION (when the second layer region is positioned on the substrate side)

TEMPERATURE-DEPENDENT PROPERTY AND SENSITIVITY LINEARITY

LIGHT RECEIVING MEMBER

BACKGROUND OF THE INVENTION

1. Field of The Invention

The present invention relates to a light receiving member sensitive to electromagnetic waves such as light (light in a broad sence such as UV-rays, visible rays, infrared rays, X-rays and y-rays).

2. Related Background Art

For photoconductive materials to constitute a light receiving layer of a light receiving member for use in the image-forming field, it is required that they have high sensitivity, high S/N ratio (photocurrent (IP)/dark current (ID)), absorption spectrum characteristics suited to electromagnetic waves to be irradiated, rapid responsibility to light and desired dark resistance, as well as they are not harmful to human bodies. In particular, for light receiving members to be employed in electrophotographic apparatus which are used as business machines at the office, it is important that they cause no public pollution during use.

In recent years, photoconductive materials comprising amorphous silicon (a-Si) materials such as amorphous silicon hydrides (hereinafter referred to as a-Si:H) have been evaluated to satisfy these requirements. Particularly, there are a number of proposals for the use of such amorphous silicon photoconductive material in an electrophotographic light receiving member.

For instance, U.S. Pat. No. 4,265,991 discloses an electrophotographic light receiving member in which such a-Si photoconductive material is used.

In the production of a light receiving member comprising such a-Si material, there is generally employed a manner of forming an a-Si deposited film as a photoconductive layer on a substrate maintained at a temperature of 50 to 350° C. by a film-forming process by means of vacuum evaporation, sputtering, ion plating, thermal-induced CVD, light-induced CVD, or plasma CVD.

Of these film-forming processes, the film-forming process by means of plasma CVD in which glow discharge is caused in a silicon-containing raw material gas to decompose said raw material gas whereby forming an a-Si deposited film on a substrate maintained at a desired temperature has been evaluated as being preferable and it has been frequently employed in the production of a light receiving member.

U.S. Pat. No. 5,382,487 discloses an electrophotographic light receiving member comprising an electrically conductive substrate and a photoconductive layer constituted by an a-Si material containing halogen atoms (X) (this a-Si material will be hereinafter referred to as a-Si:X). This document describes that the incorporation of halogen atoms in an amount of 1 to 40 atomic % enables to form a photoconductive layer having high heat resistance and good electrical and optical properties which is suitable for use in an electrophotographic light receiving member.

Japanese patent application Laid-open No. 57-115556 discloses that for a photoconductive member having a photoconductive layer comprising an a-Si deposited film, in order to attain improvements in its electrical, optical and photoconductive properties such as dark resistance, photosensitivity, and photoresponsibility, use environmental characteristics such as moisture resistance, and stability with time, a surface barrier layer constituted by a non-photoconductive amorphous material containing silicon and carbon atoms is disposed on a photoconductive layer constituted by an amorphous material containing silicon atoms as a matrix.

Japanese patent application Laid-open No. 60-67951 discloses a photosensitive member having a light transmissive insulating overcoat layer containing amorphous silicon, carbon, oxygen and fluorine.

U.S. Pat. No. 4,788,120 discloses that an amorphous material containing silicon atoms, carbon atoms and hydrogen atoms in an amount of 41 to 70 atomic % is used as a surface layer in a light receiving member.

Japanese patent application Laid-open No. 62-83470 discloses that for a photoconductive layer of an electrophotographic photosensitive member, it is made to have less than 0.09 eV of a characteristic energy of the exponential tail in a light absorption spectrum, whereby attaining a high quality image with on ghost.

Japanese patent application Laid-open No. 58-21257 discloses a technique of obtaining a photosensitive member having a high electric resistance and a widened photosensitive region by changing the substrate temperature during the formation of of a photoconductive layer therefor to make the resulting photoconductive layer have a varied forbidden band width.

Japanese patent application Laid-open No. 58-121042 discloses a technique of varying the energy gap state density of a photoconductive layer in the layer thickness direction to make a surface layer have an energy gap state density of $10^{17}$ to $10^{19}$ cm$^{-3}$, whereby preventing the surface potential from being decreased due to moisture.

Japanese patent applications Laid-open Nos. 59-143379 and 61-201481 disclose a technique of obtaining a photosensitive member having a high dark resistance and a high photosensitivity by stacking a plurality of a-Si:H films each having a different hydrogen content.

Japanese patent application Laid-open No. 60-95551 discloses a technique of improving the quality of an image reproduced by an a-Si photosensitive member by conducting image-formation comprising charging, exposure, development and transferring processes while maintaining the temperature in the vicinity of the surface of the photosensitive member at 30 to 40° C. thereby to prevent occurrence a smeared image along with a reduction in the surface resistance of the photosensitive member which is caused due to moisture absorbed at the surface of the photosensitive member.

According to the techniques described in the above documents, it is possible to attain electrical, optical and photoconductive characteristics, and use-environmental characteristics at a certain level for a light receiving member for use in electrography, whereby an improvement can be attained in the quality of an image reproduced by the light receiving member. However, for a light receiving member having a photoconductive layer constituted by an a-Si material for use in electrophotography, there still exists a room for a further improvement in view of overall characteristics including electrical, optical and photoconductive characteristics such as dark resistance, photosensitivity, and photoresponsibility, use-environmental characteristics, stability and durability upon continuous use over a long period of time.

In addition, in recent years, there has been made a rapid progress in electrophotographic apparatus such that they have a further improved image reproduction performance so as to reproduce a higher quality image and further improvements in their reproduction speed and durability. In this connection, for a light receiving member used in such electrophotographic apparatus, there is an increased demand for still further improving the electrical and photoconductive properties so as to exhibit a significantly upgraded image-forming performance in any environment while attaining a still further improvement not only in the charge retentivity but also in the photosensitivity.

Particularly, for the electrophotographic apparatus, as a result of having made improvements on their optical exposure devices, developing devices, transfer devices and so forth so so to reproduce a higher quality image as above described, there is such increased demand as above described for the light receiving member used therein.

Recent years, electric computers have been widely using in not only offices but also general houses and digitalization of character images have been progressing. Along with this, there is an increased demand also for digitalizing not only a conventional electrophotographic apparatus but also an electrophotographic apparatus which will be developed in the future since these electrophotographic apparatus pay a role as a facsimile or printer. For semiconductor lasers or LEDs (light-emitting diodes) used for the digitalization, there are usually used those having a long wavelength of infrared region to red visible light region. In this case, some problems concerning the characteristics of the light receiving member used, which can be disregarded in the case of an analogue electrophotographic apparatus, become serious and are, therefore, necessary to be solved.

These problems are possible to be solved at a certain level by the foregoing techniques in the prior art. However, any of the conventional light receiving members is not satisfactory in such digital electrophotographic system and is necessary to be more improved particularly with respect to the charge retentivity and image-forming performance so as to stably and continuously reproduce a high quality image also in the digital system.

For instance, in order for a conventional amorphous silicon series light receiving member to attain reproduction of a high quality in the digital electrophotographic system, it is required to minimize the variation in the electrophotographic characteristics due to a change in the environmental temperature, light fatigue, blank memory, and exposure memory such as ghost. And in the digital electrophotographic system using a laser or LED having a long wavelength as above described, it has become necessary to have a due care about temperature-dependent sensitivity in which a gradient of a curve of the interrelations between the quantity of light irradiated and the charge retentivity of a light receiving member is changed due to a change in the environmental temperature and sensitivity linearity where said gradient is dulled into a non-linear state, of which no attention has been made in the past.

In fact, in the prior art, in order to prevent a conventional light receiving member from causing a smeared image on an image reproduced, as described in Japanese patent application Laid-open No. 60-95551, a drum heater is installed in an electrophotographic apparatus to maintain the surface of the light receiving member at about 40° C.

However, in the case of the conventional light receiving member, the temperature dependency of the charge retentiviy (or so-called temperature-dependent property in other words) due to generation of a pre-exposure carrier or thermally excited carrier is so great that there is no way other than to use the light receiving member in a state with a lower charge retentivity than that originally possessed by the light receiving member under the practical use environment in the electrophotographic apparatus. For instance, the charge retentivity of the light receiving member is liable to drop by about 100 V when heated to about 40° C. by the drum heater, in comparison with the case when used at room temperature.

Incidentally, at night when an electrophotographic apparatus (or an electrophotographic copying machine) is not used, there is sometimes taken a measure of keeping the drum heater installed therein electrified in order to prevent an ozone product caused by corona discharge of the charger from depositing on the surface of the light receiving member, which results in causing a smeared image on an image reproduced. However, it tends to refrain taking such measure for the purposes of saving natural resources and electric-power. In this case where the drum heater of the electrophotographic apparatus is kept electrified without being suspended, a problem is liable to entail in that when copying shot is continuously conducted, the surrounding temperature of the light receiving member in the electrophotographic apparatus is gradually increased to cause a raise in the temperature of the light receiving member, where the charge retentivity of the light receiving member is deteriorated to vary the density of an image reproduced.

In addition, in the case of a digital electrophotographic copying machine in which laser beam is used, when the light receiving member used therein is not maintained constant at a desired temperature by means of a temperature controller such as the foregoing drum heater, a problem is liable to entail in that the surrounding temperature of the light receiving member is changed to cause a variation in the sensitivity of the light receiving member due to the foregoing temperature-dependent sensitivity or sensitivity linearity, where the density of an image reproduced is varied.

Besides, when an original is repeatedly and continuously subjected to reproduction, a variation in the density of an image reproduced and occurrence of a fogged image are sometimes occurred because of light fatigue of the light receiving member due to repeated image exposure. In addition, blank memory and so-called ghost are problematic in the case of attaining an improvement in the quality of an image reproduced, said blank memory being a phenomenon which causes a density variation on images reproduced due to the effects of so-called blank exposure which is applied onto the light receiving member in order to save the amount of toner used, said ghost being a phenomenon in which an image remaining after the image exposure in previous reproduction is appeared on an image obtained in the subsequent reproduction.

Accordingly, in designing a light receiving member for use in electrophotography, it is required to achieve improvements from the overall viewpoints of layer and chemical composition of each constituent layer of the light receiving member so that the foregoing problems can be desirably solved, and also to achieve a much more improvement in the property of the a-Si materials themselves.

SUMMARY OF THE INVENTION

The present invention is aimed at eliminating the foregoing disadvantages involved in the conventional amorphous silicon series light receiving member for use in electrophotography (that is, the conventional electrophotographic light receiving member having a light receiving layer composed of an amorphous silicon material) and providing a light receiving member having an improved light receiving layer composed of a non-single crystal material containing silicon atoms as a matrix which is desirably usable in electrophotography without said disadvantages in the prior and while meeting the foregoing demands.

Another object of the present invention is to provide a light receiving member having an improves light receiving layer constituted by a non-single crystal material containing silicon atoms as a matrix and which exhibits a markedly improved charge retentivity while minimizing the temperature dependency and exposure memory at an improved level and enable to stably and continuously reproduce a superior quality image.

A further object of the present invention is to a light receiving member having an improves light receiving layer constituted by a non-single crystal material containing silicon atoms as a matrix and which always and substantially stably exhibits desirable electrical, optical and photoconductive properties without depending on use environments, has a superior resistance to light fatigue, has superior durability and moisture resistance, and is substantially free of problems relating to deterioration phenomenon and residual potential even when continuously used over a long period of time where a high quality image is always obtained.

A further object of the present invention is to provide a light receiving member having a light receiving layer with a specific photoconductive layer constituted by a non-single crystal material containing silicon atoms as a matrix and at least one kind of atoms selected from the group consisting of hydrogen atoms and halogen atoms, wherein said photoconductive layer contains a plurality of layer regions which are different from each other with respect to (a) characteristic energy at an exponential tail obtained from a light absorption spectrum, (b) hydrogen content and (c) optical band gap.

A further object of the present invention is to provide a light receiving member having has a light receiving layer with a photoconductive layer constituted by a non-single crystal material containing silicon atoms as a matrix and at least one kind of atoms selected from the group consisting of hydrogen atoms and halogen atoms, wherein said photoconductive layer contains a specific first layer region and a specific second layer region being stacked, said first layer region being of 55 to 65 meV in the characteristic energy (a), 15 to 25 atomic % in the hydrogen content (b), and 1.75 to 1.80 eV in the optical band gap (c); and said second layer region being of 45 to 55 meV in the characteristic energy (a), 10 to 20 atomic % in the hydrogen content (b), and 1.65 to 1.75 eV in the optical band gap (c).

DESCRIPTION OF THE INVENTION AND THE PREFERRED EMBODIMENTS

Figure 1:
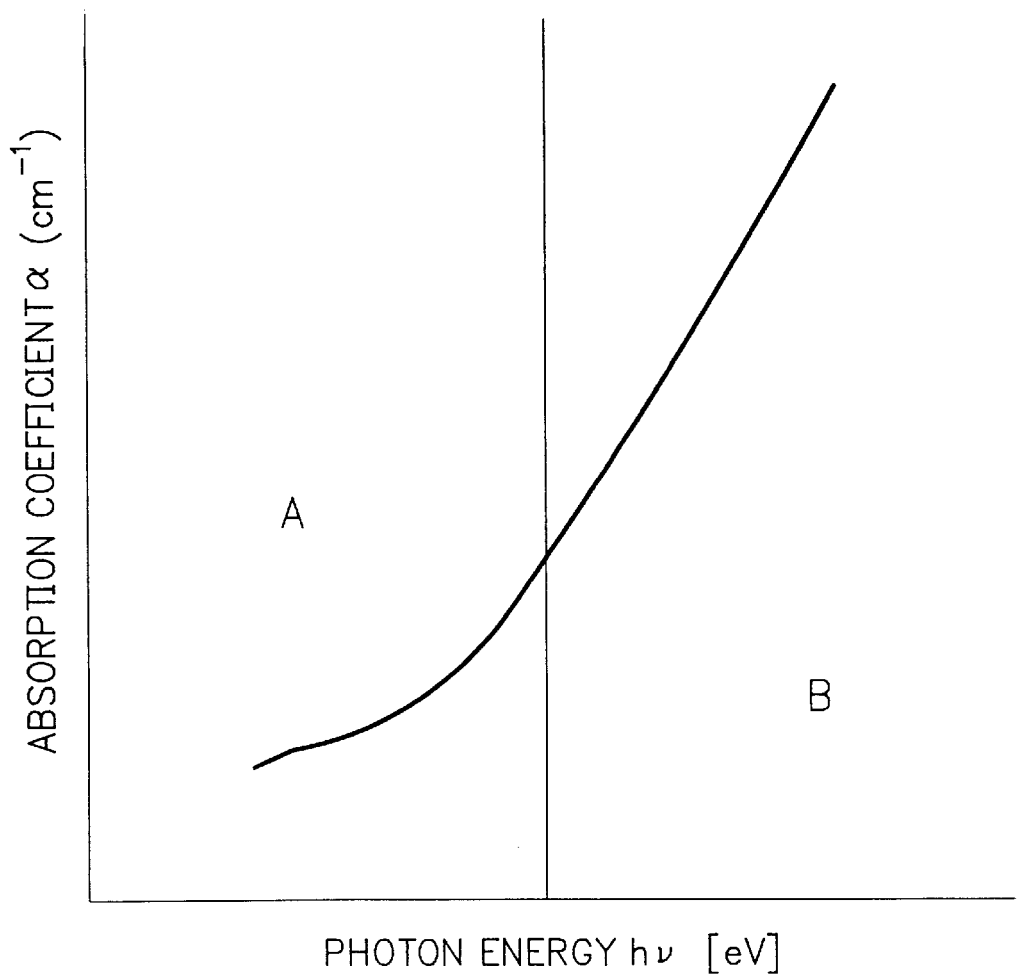
FIG. 1 is a schematic graph for explaining a characteristic energy at the exponential tail, where an example of a sub-gap light absorption spectrum of an a-Si is shown.

In order to solve the foregoing problems in the prior art and in order to attain the object of the present invention, the present inventors conducted various experimental studies of interrelations between localized gap state density distribution, temperature-dependent property and exposure memory for a photoconductive layer constituted by an a-Si material used in a light receiving member for use in electrophotography while focusing on the behavior of photocarrier in the photoconductive layer. As a result, there were obtained such findings as will be described below.

(1) The object of the present invention can be attained by properly controlling the hydrogen content, optical band gap and localized gap state density distribution in the thickness direction of the photoconductive layer. Particularly, for a light receiving member having a photoconductive layer constituted by a non-single crystal material containing silicon atoms as a matrix and at least hydrogen atoms and/or halogen atoms, when the layer structure of the photoconductive layer is specified, there can be attained a desirable light receiving member which exhibits extremely superior characteristics in practical use, is surpassing any amorphous silicon series conventional light receiving members in all respects, and when used in electrophotography, exhibits superior electrophotographic characteristics.

(2) For a light incident portion of the photoconductive layer which concerns photoelectric conversion, when the hydrogen content, optical band gap and localized gap state density distribution are properly controlled so as to optimize against light with a long wavelength (laser or LED) which is used in a digitalized electrophotographic system, there can be attained a desired improvement in the temperature-dependent sensitivity and also in the sensitivity linearity.

(3) For a light receiving member having a photoconductive layer constituted by a non-single crystal material containing silicon atoms as a matrix and at least one kind of atoms selected from the group consisting of hydrogen atoms and halogen atoms, when said photoconductive layer is designed to contain a plurality of layer regions which are different from each other with respect to characteristic energy at an exponential tail obtained from a light absorption spectrum, hydrogen content and optical band gap, there can be attained a desirable light receiving member which is free of the problems relating to temperature-dependent sensitivity and sensitivity linearity which are found in the prior art using a laser having a long wavelength, is superior in charge retentivity and temperature-dependent property, and is free of occurrence of exposure memory.

The present invention has been accomplished based on these findings.

A typical embodiment further of the present invention lies in a light receiving member having a light receiving layer with a photoconductive layer constituted by a non-single crystal material containing silicon atoms as a matrix and at least one kind of atoms selected from the group consisting of hydrogen atoms and halogen atoms, wherein said photoconductive layer contains a plurality of layer regions which are different from each other with respect to (a) characteristic energy at an exponential tail obtained from a light absorption spectrum, (b) hydrogen content and (c) optical band gap.

A preferred embodiment of the photoconductive layer in the light receiving member according to the present invention is that the photoconductive layer contains a specific first layer region and a specific second layer region being stacked, said first layer region being of 55 to 65 meV in the characteristic energy (a), 15 to 25 atomic % in the hydrogen content (b), and 1.75 to 1.80 eV in the optical band gap (c); and said second layer region being of 45 to 55 meV in the characteristic energy (a), 10 to 20 atomic % in the hydrogen content (b), and 1.65 to 1.75 eV in the optical band gap (c).

The photoconductive layer in the present invention is desired to be designed such that the second layer region has a layer thickness corresponding to a value in the range of more than 3% to less than 50% versus the total thickness of the photoconductive layer.

For the second layer region in the present invention, it may be designed to comprise two second layer regions (i) and (ii) such that one of them (that is, the second layer region (i)) is stacked on a electrically conductive substrate, the first layer region is stacked on the second layer region (i), and the remaining second layer region (ii) is stacked on the first layer region.

When the second later region is stacked on the front side of the first layer region, it is desired to be formed to such a thickness that provides a light absorption factor of 80 to 95% for the wavelength of laser used in image exposure.

The photoconductive layer in the present invention may contain atoms of at least an element belonging to group IIIb or Vb of the periodic table or/and at least one kind of atoms selected from the group consisting of carbon atoms, oxygen atoms and nitrogen atoms.

In the light receiving member according to the present invention, it is desired to dispose a surface layer constituted by a silicon-containing non-single material containing at least one kind of atoms selected from the group consisting of carbon atoms, oxygen atoms and nitrogen atoms on the photoconductive layer.

Further, the light receiving member according to the present invention may contain a charge injection inhibition layer. In this case, the layer configuration is desired to be made such that the photoconductive layer is disposed on a charge injection inhibition layer constituted by a non-single crystal material containing silicon atoms as a matrix, at least one kind of atoms selected from the group consisting of carbon atoms, oxygen atoms and nitrogen atoms and atoms of at least an element belonging to group IIIb or Vb of the periodic table, and a surface layer constituted by a silicon-containing non-single material containing at least one kind of atoms selected from the group consisting of carbon atoms, oxygen atoms and nitrogen atoms is disposed on the photoconductive layer.

For the thickness of the surface layer, it is desired to be in the range of 0.01 to 3 μm. For the thickness of the charge injection inhibition layer, it is desired to be in the range of 0.1 to 5 μm. For the thickness of the photoconductive layer, it is desired to be in the range of 20 to 50 μm.

The term "exponential tail" in the present invention represents a tail on the low-energy side of a light absorption spectrum, and the term "characteristic energy" means the gradient of the exponential tail.

This will be explained with reference to FIG. 1 in the following.

FIG. 1 shows an example of a sub-gap light absorption spectrum of an amorphous silicon material in which photon energy hγ is shown on the abscissa, and a logarithm of absorption coefficient α is shown on the ordinate. This spectrum is roughly divided into two parts including part B (exponential tail or Urbach tail) where the absorption coefficient α exponentially changes, i.e., linearly changes, with photon energy hγ, and part A where absorption coefficient α shows low dependency on photon energy hγ.

Part B corresponds the light absorption caused by optical transition from the tail level on the valence band side to the conduction band in the amorphous silicon material. In part B, the exponential dependency of absorption coefficient α on hγ is represented by the following equation.

$$\alpha = \alpha_o \exp(h\gamma/Eu)$$

If both sides of this equation are transformed to logaritrithms, the following equation is obtained.

$$ln = (1/Eu)h\gamma + \alpha_1, \text{ where } \alpha_1 = l\, n\alpha_o$$

Therefore, the inverse (1/Eu) of characteristic energy Eu represents the gradient of absorption coefficient in part B. Since characteristic energy Eu corresponds the characteristic energy of an exponential energy distribution in the tail level on the valence band side, a low value of Eu indicates a low tail level on the valence band side.

The present inventors examined the interrelations between an optical band gap (hereinafter referred to as "Eg"), characteristic energy (hereinafter referred to as "Eu") at the exponential tail (Urbach tail) obtained from the sub-band gap light absorption spectrum measured by CPM (constant photocurrent method) and properties of an a-Si light receiving member under various conditions. As a result, there was obtained findings as will be described in the following. The Eg and Eu closely relate to the charge retentivity, temperature-dependent property, and exposure memory, and by stacking a plurality of a-Si films each being different with respect to values of these factors, there can be attained a desirable a-si light receiving member having superior photosensitive characteristics.

Further, in order to attain optimization for laser having a long wavelength, for the Eg and Eu of a light incident portion of an a-Si light receiving member in the case of using said laser as an exposure light source, various experimental studies were conducted. As a result, there were obtained findings as will be described in the following. The Eg and Eu closely relate to the temperature-dependent sensitivity and sensitivity linearity. Particularly, when each of the Eg, Eu and hydrogen content of the light incident portion is controlled to be in a specific range, there can be attained a desirable a-Si light receiving member which exhibits superior photosensitive characteristics suitable in a digital electrophotographic system.

Specifically, in an a-Si light receiving member comprising a photoconductive layer and a surface layer disposed on said photoconductive layer, when a given layer region having a relatively small optical band gap and a small probability of trapping a photocarrier in localized level is disposed in the interfacial region between the photoconductive layer and the surface layer, the temperature-dependent sensitivity and sensitivity linearity can be markedly improved while substantially eliminating occurrence of exposure memory. Further to dispose such layer region (having a relatively small optical band gap and a small probability of trapping a photocarrier in localized level) in the interfacial region between the charge injection inhibition layer and the photoconductive layer enables to markedly improve the charge retentivity while desirably diminishing the temperature-dependent property and the exposure memory and it also enables to attain a marked improvement in the adhesion of the layered structure so as to desirably comply with an increase of stress which will be occurred in the case of conducting layer lamination on a substrate with a relatively small size.

Now, in a band gap of an a-Si:H material, there are generally present a tail (bottom) level ascribable to a structural disorder of Si-Si bonds and a deep level ascribable to structural defects such as Si-dangling bonds or the like. It is known that these levels serve to trap electrons and holes and they also serve as a recombination center for said electrons and holes, resulting in deteriorating the properties of electronic devices.

The state of localized level in such a band gap may be measured by deep level spectroscopy, isothermal volume transient spectroscopy, photothermal polarization spectroscopy, photoacoustic spectroscopy, or constant photo-current method (this will be hereinafter referred to as CPM). Of these measuring methods, CPM is useful as a method for simply measuring a sub-gap light absorption spectrum based on the localized levels of an a-Si material.

Incidentally, as the cause of a decrease in the charge retentivity of the a-Si light receiving member which will be occurred when the light receiving member is heated by a drum heater or the like, it is considered such that thermally excited carriers are led by electric fields generated upon charging to move toward the surface of the light receiving member while repeating their entrapping in and release from the localized levels of band tails and deep localized levels in a band gap, resulting in revoking surface charge. Here, the carriers having reached the surface of the light receiving member while passing through a charger little cause a decrease in the charge retentivity. But for the carriers having been entrapped in the deep levels, after having passed through the charger, they reach the surface of the light receiving member to revoke the surface charge. This situation is observed as temperature-dependent properties. In addition, those carriers which are thermally excited after having passed through the charger also result in revoking the surface charger to cause an decrease in the charge retentivity. Accordingly, in order to decrease the temperature-dependent properties, it is necessary to prevent the generation of the thermally excited carriers by enlarging the optical band gap mainly of the photoconductive layer of the light receiving member and to improve the mobility of the carriers.

The exposure memory is also caused when photocarriers generated by blank exposure or image exposure are trapped in the localized levels in the band gap and the photocarriers are remained in the photoconductive layer. Specifically, among the carriers generated in a certain electrophotographic process, those remained in the photoconductive layer are swept out by the electric field generated by the surface charge at the time of subsequent charging or thereafter, and the potential at the portion irradiated with light becomes lower than that at other potion, resulting in causing a density variation on an image reproduced. Hence, the carrier mobility is required improved so that photocarriers can mobilize through the photoconductive layer at one electrophotographic reproduction process without allowing the photocarriers to remain in the photoconductive layer.

The temperature-dependent sensitivity in a light receiving member comprising a photoconductive layer and a surface layer stacked in this order on a substrate is caused when there is a large difference between the mobility of hole and that of electron in the photoconductive layer and these mobilities are changed depending upon the temperature involved. In a light incident portion of the photoconductive layer, a given hole is paired with a given electron, and the hole mobilzes toward the substrate side and the electron mobilizes toward the surface layer side, where during these mobilizations, when holes and electrons are present as a mixture in the light incident portion, the proportion for them to be recombined before reaching the substrate or surface layer is increased. When this recombination proportion is changed by way of thermal excitation from the their retrapping center, the exposure value, i.e., the number of a photocarrier generated and the number of a carrier of revoking the surface potential are changed by the temperature involved to result in causing a variation in the sensitivity of the light receiving member. Therefore, for the light incident portion of the photoconductive layer, by diminishing the above recombination proportion, i.e., diminishing the deep level which becomes the retrapping center and increasing the light absorption coefficient for light having a long wavelength so as to make the region (in which holes and electrons are present as a mixture) smaller, the temperature-dependent sensitivity of the photoconductive layer can be improved as desired.

The sensitivity linearity is cased due to an increase in the number of an electron having a long transit range which is occurred when the number of a photocarrier generated at a position of the photoconductive layer which is relatively deep from the surface is increased as the exposure value by means of a long wavelength laser is increased.

By making the light incident portion of the photoconductive layer have an increased light absorption coefficient as above described while properly improving the electron mobility in the light incident portion of the photoconductive layer and the hole mobility on the substrate side of the photoconductive layer so that the former and the latter are well balanced, the sensitivity linearity of the photoconductive layer can be improved as desired.

Hence, by disposing a layer region in which the Ch (hydrogen content) is relatively small, and the Eg is narrowed while controlling (decreasing) the Eu, the proportion for the thermally excited carriers or photocarriers to be trapped in the localized levels can be desirably diminished and because of this, the carrier mobility can be significantly improved. Herein, to make the Eg smaller enlarges the light absorption coefficient for the long wavelength light, whereby the light incident portion of the photoconductive layer can be minimized and as a result, the region (in which holes and electrons are present as a mixture) can be diminished. As an additional advantage, for a portion of the photoconductive layer on the substrate side, it can be designed into a layer configuration in which the mobility of a principal carrier as a hole is improved. Particularly, by using a layer in which the Ch is made to be relatively large and the Eu is controlled (decreased) while enlarging the Eg as the photoconductive layer, it is possible that the generation of the thermally excited carriers is depressed and the proportion for the thermally excited carriers or photocarriers to be trapped in the localized levels is diminished. By this, the carrier mobility can be markedly improved.

Specifically, in a light receiving member, by disposing the foregoing second layer region on the outermost surface side so that the layer region serves to substantially absorbing light, the temperature-dependent sensitivity and sensitivity linearity particularly in the case of using laser beam can be markedly improved, where the charge retentivity, temperature-dependent property, and exposure memory can be also improved as desired. Similarly, by disposing the foregoing first layer region on the outermost surface side so that said layer region serves to substantially absorbing light, a significant improvement can be attained particularly with respect to charge retentivity, temperature-dependent property, exposure memory and adhesion.

As apparent from the above description, the present invention enables to attain marked improvements in the temperature-dependent sensitivity, sensitivity linearity and charge retentivity of the conventional light receiving member in the case of using a laser having a long wavelength while diminishing the temperature dependency and exposure memory at an improved level, where the foregoing problems found in the conventional light receiving member can be solved as desired. Hence, the present invention provides a markedly improved light receiving member which extremely excels in electrical, optical and photoconductive properties, image-forming performance, durability and use-environmental characteristics and which can stably and continuously reproduces a high quality image over a long period of time.

In the following, a light receiving member according to the present invention will be described in more detail while referring to the drawings.

FIGS. 2(a) through 2(e) are schematic cross-sectional views illustrating the constitution of an example of a light receiving member according to the present invention.

In FIGS. 2(a) through 2(e), reference numeral 200 indicates a light receiving member, reference numeral 201 a substrate, reference numeral 202 a light receiving layer, reference numeral 203 a photoconductive layer, reference numeral 204 a surface layer, reference numeral 205 a charge injection inhibition layer, reference numeral 210 a free surface, reference numeral 211 a first layer region, and reference numeral 212 a second layer region.

The light receiving member 200 shown in FIG. 1(a) comprises a light receiving layer 202 having a free surface 210 disposed on a substrate 201 for a light receiving member. The light receiving layer 202 in this case comprises a photoconductive layer 203 comprised of an amorphous material containing silicon atoms (Si) as a matrix and at least one kind of atoms selected from the group consisting of hydrogen atoms (H) and halogen atoms (X) (this amorphous material will be hereinafter referred to as "a-Si: H,X") and having photoconductive property. The photoconductive layer 203 contains a fist layer region 211 and a second layer region 212 in this order from the side of the substrate 201.

The light receiving member 200 shown in FIG. 1(b) comprises a light receiving layer 202 having a free surface 210 disposed on a substrate 201 for a light receiving member. The light receiving layer 202 in this case comprises a photoconductive layer 203 comprised of an a-Si:H,X having photoconductive property. The photoconductive layer 203 contains a second layer region 212 and a first layer region 211 in this order from the side of the substrate 201.

The light receiving member 200 shown in FIG. 1(c) comprises a light receiving layer 202 having a free surface 210 disposed on a substrate 201 for a light receiving member. The light receiving layer 202 in this case comprises a photoconductive layer 203 comprised of an a-Si:H,X having photoconductive property. The photoconductive layer 203 contains a second layer region 212, a first layer region 211 and another second layer region 212 in this order from the side of the substrate 201.

The light receiving member 200 shown in FIG. 1(d) comprises a light receiving layer 202 having a free surface 210 disposed on a substrate 201 for a light receiving member. The light receiving layer 202 in this case comprises a photoconductive layer 203 and a surface layer 204 stacked in this order from the side of the substrate 201, wherein the photoconductive layer 203 is comprised of an a-Si:H,X having photoconductive property, and the surface layer 204 is comprised of an amorphous silicon material. The photoconductive layer 203 contains a fist layer region 211 and a second layer region 212 in this order from the side of the substrate 201. In this configuration, it is possible to replace the position of the first layer region 211 by that of the second layer region 212. Further, it is possible to dispose an additional second layer region (212) between the substrate 201 and the first layer region 211.

The light receiving member 200 shown in FIG. 1(e) comprises a light receiving layer 202 having a free surface 210 disposed on a substrate 201 for a light receiving member. The light receiving layer 202 in this case comprises a charge injection inhibition layer 205, a photoconductive layer 203 and a surface layer 204 stacked in this order from the side of the substrate 201, wherein the charge injection inhibition layer 205 is comprised of an amorphous silicon material, the photoconductive layer 203 is comprised of an a-Si:H,X having photoconductive property, and the surface layer 204 is comprised of an amorphous silicon material. The photoconductive layer 203 contains a fist layer region 211 and a second layer region 212 in this order from the side of the charge injection inhibition layer 205. In this configuration, it is possible to replace the position of the first layer region 211 by that of the second layer region 212. Further, it is possible to dispose an additional second layer region (212) between the charge injection inhibition layer 205 and the first layer region 211.

It should be noted that the present invention is not limited to these embodiments, and these embodiments may be properly modified as desired.

In the following, description will be made of each constituent of the light receiving member according to the present invention.

Substrate

The substrate 201 used in the present invention may be either electrically conductive or electrically insulative.

The electrically conductive substrate can include, for example, metals such as Al, Cr, Mo, Au, In, Nb, Te, V, Ti, Pt, and Fe; and alloys of these metals such as stainless steel and the like. The electrically insulative substrate can include, for example, films or sheets of synthetic resins such as polyester, polyethylene, polycarbonate, cellulose acetate, polypropylene, polyvinyl chloride, polystyrene, and polyamide, glass and ceramics. For the electrically insulative substrate, it is desired that at a surface thereof on which a film is to be deposited is applied with electroconductive treatment.

The substrate 201 may be of any configuration such as cylindrical or belt-like shape each having a smooth or uneven surface. The thickness of the substrate should be properly determined so that the light receiving member 200 can be produced as desired. In the case where flexibility is required for the light receiving member 200, it can be made as thin as possible within a range capable of sufficiently providing the function as the substrate. However, the thickness is usually grater than 10 $\mu$m in view of the fabrication and handling or physical strength of the substrate.

When image-recording is conducted using coherent light such as laser beam or the like, the substrate 201 may be designed to have an uneven surface on which a light receiving layer is to be disposed, in order to effectively prevent occurrence of defective images based on interference fringe patterns. The formation of such uneven surface for the substrate may be conducted in accordance with a conventional manner disclosed in U.S. Pat. No. 4,650,736, U.S. Pat. No. 4,696,884 or U.S. Pat. No. 4,705,733.

Besides, in order to effectively prevent occurrence of defective images based on interference fringe patterns, it is possible for the substrate 201 to have an uneven surface provided with a plurality of spherical dimples on which a light receiving layer is to be disposed. Specifically, the uneven surface of the substrate in this case comprises a plurality of minute irregularities having a magnitude which is smaller the resolution power required for the light receiving member 200, where the irregularities are based on a plurality of spherical dimples. The formation of such uneven surface provided with such spherical dimples as above described for the substrate 201 may be conducted by a conventional manner disclosed in U.S. Pat. No. 4,735,883.

Photoconductive Layer

The photoconductive layer 203 which is formed on the substrate 201 and which is a constituent of the light receiving layer 202 may be formed by means of a vacuum deposited film-forming process under numerical conditions of film formation parameters which are determined so as to cause the formation of a layer having desired properties as the photoconductive layer.

Such vacuum deposited film-forming process can include glow discharge film-forming process such as A.C. glow discharge CVD such as low-frequency plasma CVD, high-frequency plasma CVD, or microwave plasma CVD, and D.C discharge CVD; sputtering; vacuum evaporation; ion plating; photo CVD; thermal-induced CVD; and the like.

These film-forming processes can be selectively used depending on the related factors such as manufacturing conditions, the degree of a load on capital investment in equipments, the manufacturing scale and properties desired for a light receiving member produced. However, glow discharge film-forming process, particularly glow discharge film-forming process using a high frequency with RF band or VHF band, is preferred in a viewpoint that the related conditions for the production of a light receiving member having desired characteristics can be relatively easily controlled.

Basically, when a photoconductive layer 203 comprising an a-Si:H,X is formed by the glow discharge film-forming process, a gaseous raw material capable of supplying silicon atoms (Si) (hereinafter referred to as Si-supplying raw material gas) and a gaseous raw material capable of supplying hydrogen atoms (H) (hereinafter referred to as H-supplying raw material gas) or/and a gaseous raw material capable of supplying halogen atoms (X) (hereinafter referred to as X-supplying raw material gas) are introduced into a deposition chamber capable of being vacuumed, where glow discharge is caused to form a layer comprising an a-Si:H,X deposited film on a substrate 201 positioned in the deposition chamber while being maintained at a desired temperature.

The photoconductive layer 203 in the present invention is necessary to contain hydrogen atoms (H) or/and halogen atoms (X) in addition to the silicon atoms (Si). The incorporation of the hydrogen atoms or/and halogen atoms into the photoconductive layer is essential for compensating dangling bonds of the silicon atoms and also for improving the layer quality, particularly, the photoconductivity and charge retaining property.

The amount of the hydrogen atoms or halogen atoms contained or the total amount of these two atoms is desired to be preferably in the range of 20 to 30 atomic % in the case of the first layer region and is desired to be preferably in the range of 10 to 20 atomic % in the case of the second layer region.

The foregoing Si-supplying raw material gas can include, for example, gaseous or gasifiable silicon hydrides (silanes) such as $SiH_4$, $Si_2H_6$, $Si_3H_8$, $Si_4H_{10}$, and the like. Of these, $SiH_4$ and $Si_2H_6$ are particularly preferred in view of the easy layer forming work and the good efficiency for the supply of Si.

In order to structurally introduce the hydrogen atoms into a photoconductive layer 103 to be formed and in order to facilitate the control of the ratio of the hydrogen atoms introduced to obtain desired film characteristics for achieving the object of the present invention, the layer formation is desired to be conducted in an atmosphere in which the Si-supplying raw material gas is mixed with a desired amount of $H_2$ gas and/or He gas or a gaseous silicon compound containing hydrogen atoms. These raw material gases may be mixed either singly or in combination at a desired mixing ratio.

The foregoing X-supplying raw material gas for introducing the halogen atoms (X) into the photoconductive layer can include, for example, gaseous or gasifiable halogen compounds such as gaseous halogen, halides, inter-halogen compounds, and halogen-containing silicon compounds, i.e., halogen-substituted silane derivatives. Specific preferable examples are fluorine gas ($F_2$) and inter-halogen compounds such as BrF, ClF, $ClF_3$, $BrF_3$, $BrF_5$, $IF_3$, $IF_7$, and the like. Specific preferable example of the halogen-substituted silane derivative are silicon fluorides such as $SiF_4$, $Si_2F_6$, and the like.

To control the amount of the hydrogen atoms (H) or/and the halogen atoms (X) to be contained in the photoconductive layer 203 may be conducted, for example, by properly controlling the temperature of the substrate 201, the amount of the H-supplying raw material gas or/and that of the X-supplying raw material gas to be introduced into the deposition chamber, or the discharging power, respectively upon the formation of a deposited film as the photoconductive layer 203.

In the present invention, if necessary, the photoconductive layer 203 may contain atoms of an element capable controlling the conductivity (this element will be hereinafter referred to as conductivity controlling element). In this case, atoms of a given conductivity controlling element may be contained in the photoconductive layer such that they are uniformly distributed in the entire layer region or they are unevenly distributed in the layer thickness direction in a partial layer region.

The conductivity controlling element can include so-called impurities in the field of semiconductor. Specifically, the conductivity controlling element can include elements capable of imparting p-type conductivity which belong to group IIIb of the periodic table (this element will be hereinafter referred to as group IIIb element) and elements capable of imparting n-type conductivity which belong to group Vb of the periodic table (this element will be hereinafter referred to as group Vb element).

Specific examples of the group IIIb element are boron (B), aluminum (Al), gallium (Ga), indium (In), and thallium (Tl). Of these, B, Al and Ga are particularly preferred.

Specific examples of the group Vb element are phosphorous (P), arsenic (As), antimony (Sb), and bismuth (Bi). Of these, P and As are particularly preferred.

The amount of the atoms of a given conductivity controlling element selected from those above mentioned (this atoms will be hereinafter referred to as conductivity controlling atoms) contained in the photoconductive layer is desired to be preferably in the range of $1 \times 10^{-2}$ to $1 \times 2^2$ atomic ppm, more preferably in the range of $5 \times 10^{-2}$ to 50 atomic ppm, most preferably in the range of $1 \times 10^{-1}$ to 10 atomic ppm.

It is desired that the amount of the conductivity controlling atoms contained in the second layer region is greater than that contained in the first layer region.

In order to structurally introduce the conductivity controlling atoms, i.e., the group IIIb atoms or the group Vb atoms, into the photoconductive layer 203, a raw material gas capable of supplying group IIIb or Vb atoms is introduced into the deposition chamber together with other raw material gases for the formation of the photoconductive layer upon the formation of a deposited film as the photoconductive layer. As the raw material gas capable of supplying the group IIIb or Vb atoms, those which are in the gaseous state at room temperature and normal pressure or can be easily gasified at least under conditions for the formation of the photoconductive layer may be selectively used.

The raw material gas capable of supplying the group IIIb atoms can include boron hydrides such as $B_2H_6$, $B_4H_{10}$, $B_5H_9$, $B_5H_{11}$, $B_6H_{10}$, $B_6H_{12}$, and $B_6H_{14}$, and boron halides such as $BF_3$, $BCl_3$, and $BBr_3$, which can supply boron atoms. Besides, it can include $AlCl_3$, $GaCl_3$, $GA(CH_3)_3$, $InCl_3$, and $TlCl_3$.

The raw material gas capable of supplying the group Vb atoms can include phosphorous hydrides such as PH and $P_2H_4$, phosphorous halides such as $PH_4I$, $PF_3$, $PF_5$, $PCl_3$, $PCl_5$, $PBr_3$, $PBr_5$, and $PI_3$, which can supply phosphorous atoms. Besides, it can include $SbF_5$, $SbCl_3$, $SbCl_5$, $BiH_3$, $BiCl_3$ and $BiBr_3$.

These raw material gases used for introducing the conductivity controlling atoms into the photoconductive layer may be diluted with $H_2$ gas or/and He gas, if necessary.

In the present invention, it is effective for the photoconductive layer 203 to contain at least one kind of atoms selected from the group consisting of carbon atoms (C), oxygen atoms (O) and nitrogen atoms (N) (the atoms herein will be hereinafter referred to as atoms (C,O,N)).

The amount of the atoms (C,O,N) contained in the photoconductive layer is desired to be preferably in the range of $1 \times 10^{-5}$ to 10 atomic %, more preferably in the range of $1 \times 10^{-4}$ to 8 atomic %, most preferably in the range of $1 \times 10^{-3}$ to 5 atomic %, respectively versus the total amount of the silicon atoms and the atoms (C,O,N) contained. The atoms (C,O,N) may be contained in the photoconductive layer such that their concentration distribution are uniform in the entire layer region or uneven in the layer thickness direction in a partial layer region.

For the thickness of the photoconductive layer 203, it should be adequately determined in the viewpoints of desired electrophotographic properties and economical advantages. However, in general, it is preferably in the range of 20 to 50 µm, more preferably in the range of 23 to 45 um, most preferably in the range of 25 to 40 µm. When the thickness is less than 20 µm, a problem is liable to entail in that the electrophotographic properties such as charge retentivity, sensitivity and the like become unsatisfactory for practical use. When the thickness is beyond 50 µm, a problem is liable to entail in that a long period of time is required for the formation of the photoconductive layer, resulting in an increase in the production cost of a light receiving member.

In the present invention, the second layer region is desired to be designed to have a thickness corresponding to 3 to 50% versus the total layer thickness of the photoconductive layer 203 (the first layer region+the second layer region). When the thickness of the second layer region is less than 3%, a problem is liable to entail in that the charge injection-preventing function become unsatisfactory.

And particularly when the second layer region is positioned on the side of the surface layer in the case of using a laser having a long wavelength, the second layer region is desired to be designed to have a thickness having a light absorption coefficient in the range of 80 to 95% for the laser wavelength. When the thickness is of a light absorption coefficient of less than 80%, light will reach a relatively deep portion of the first layer region designed to be effective for holes to mobilize, wherein as said portion of the first layer region is smaller in terms of the mobility of electrons in comparison with the second layer region, there is an occasion when it cannot exhibit an effect of desirably improving the temperature-dependent sensitivity and sensitivity linearity. When the thickness is of a light absorption coefficient of beyond 95%, a problem is liable to entail in that a number of holes are required to mobilize for a long range in the second layer region.

In general, for the second layer region positioned on the side of the surface layer, doping is substantially not conducted in view of the importance for electrons to mobilize. Because of this, the hole mobility of the second layer region is relatively small, where an increase in the sensitivity and residual potential is liable to entail. This situation makes it difficult to achieve the effects of the present invention. When doping is conducted for this portion aiming at enlarging the hole mobility, the electron mobility becomes small, where the sensitivity becomes undesirably large to entail problems such as a decrease in the charge retentivity, an attenuation in the dark resistance and the like. This situation makes it difficult to achieve the effects of the present invention.

In order to form a deposited film having a desired film property suitable as the second layer region, at the present time, the deposition rate at the time of forming the second layer region is desired to be somewhat smaller than that at the time of forming the first layer region. When the thickness of the second layer region is made to be beyond 50% versus the total layer thickness of the photoconductive layer 203, a problem is liable to entail in that a long period of time is required for the formation of the photoconductive layer, resulting in an increase in the production cost of a light receiving member. Therefore, this situation should be taken into consideration.

When the second layer region is positioned on the side of the surface layer as above described, it can absorb 80 to 95% of coherent light such as laser beam. Because of this, there can be obtain a high quality image without having a particular measure of preventing occurrence of a problem relating to interference fringe patterns for the substrate or a lower layer.

In order for the photoconductive layer 203 to be formed to have desired properties, the related parameters such as the mixing ratio between the Si-supplying raw material gas and the dilution gas, the gas pressure in the deposition chamber, the discharging power and the substrate temperature are adequately controlled upon the formation of the photoconductive layer.

For the flow rate of $H_2$ gas or/and He gas used as the dilution gas, it should be properly determined within an optimum range in accordance with the design of the layer. However, in general, it is desired to be controlled preferably in the range of 3 to 20 times, more preferably in the range of 4 to 15 times, most preferably in the range of 5 to 10 times, respectively over the flow rate of the Si-supplying raw material gas.

The gas pressure in the deposition chamber should be also properly determined within an optimum range in accordance with the design of the layer. However, in general, it is preferably in the range of $1\times10^{-4}$ to 10 Torr (in the range of $1.333\times10^{-2}$ to $1.333\times10^{3}$ Pa), more preferably in the range of $5\times10^{-4}$ to 5 Torr (in the range of $6.665\times10^{-2}$ to $6.665\times10^{2}$ Pa), most preferably in the range of $1\times10^{-3}$ to 1 Torr (in the range of $1.333\times10^{1}$ to $1.333\times10^{2}$ Pa).

The discharging power should be also properly determined within an optimum range in accordance with the design of the layer. However, in general, the ratio (W/cc) of discharging power to the flow rate of the Si-supplying raw material gas is desired to be preferably in the range of 1 to 8, more preferably in the range of 1 to 6.

It is desired that the ratio of the discharging power to the flow rate of the Si-supplying raw material gas in the formation of the second layer region is made to be smaller than that in the formation of the first layer region and the formation of the second layer region is conducted in a so-called power-limit zone.

The substrate temperature should be also properly determined within an optimum range in accordance with the design of the layer. However, in general, it is desired to be preferably in the range of 200 to 350° C., more preferably in the range of 230 to 330° C., most preferably in the range of 250 to 300° C.

The conditions for the formation of the photoconductive layer of the present invention are determined within the above described ranges. However, the actual conditions such as the substrate temperature, the discharging power, and the gas pressure in the deposition chamber cannot usually be determined with ease independent of each other. Accordingly, the conditions optimum to the layer formation are desired to be properly determined based on relative and organic relationships for forming the photoconductive layer having desired properties.

Surface Layer

In the present invention, a surface layer 204 constituted by an amorphous silicon material is desired to be formed on the foregoing photoconductive layer 203 formed on the substrate 201.

Figure 2A:
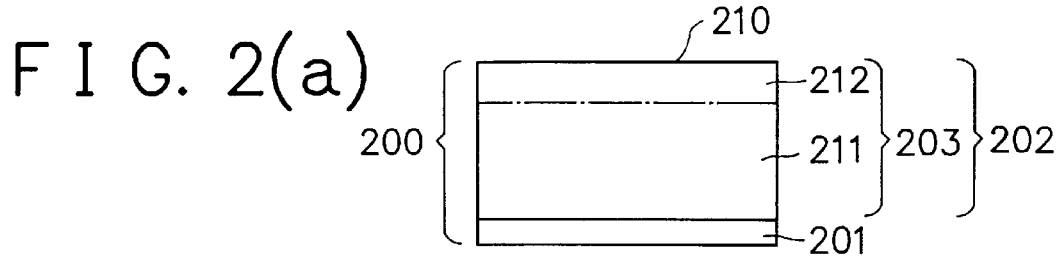
FIGS. 2(a) through 2(e) are schematic cross-sectional views respectively illustrating a layer configuration of an example of a light receiving member according to the present invention.
Figure 2B:
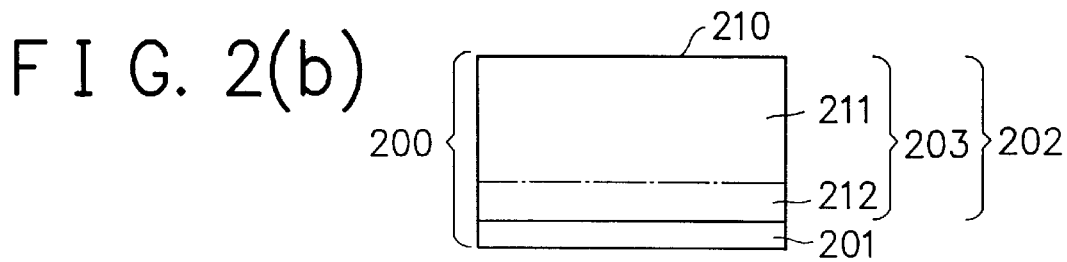
Figure 2C:
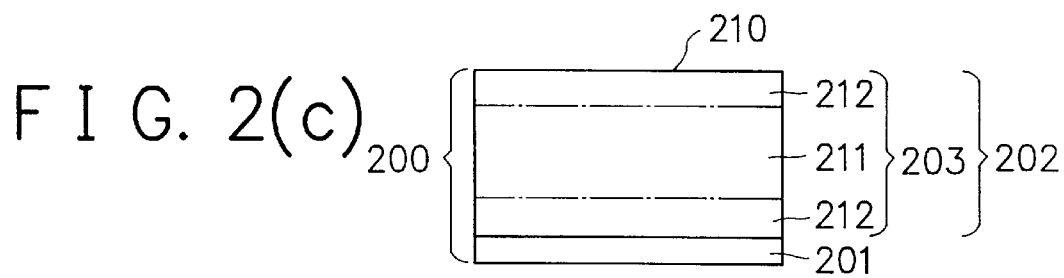
Figure 2D:
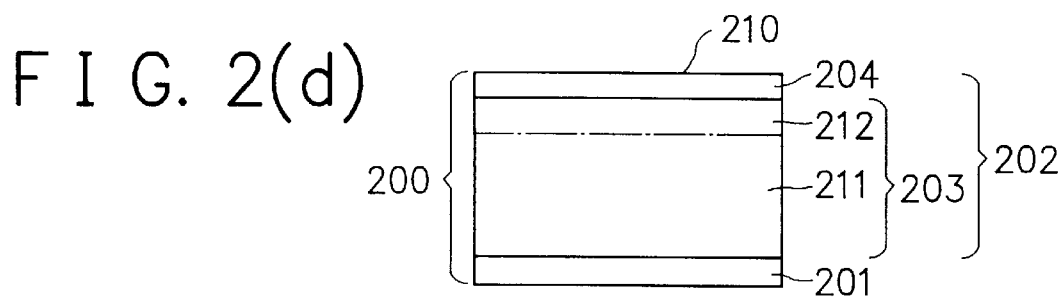
Figure 2E:
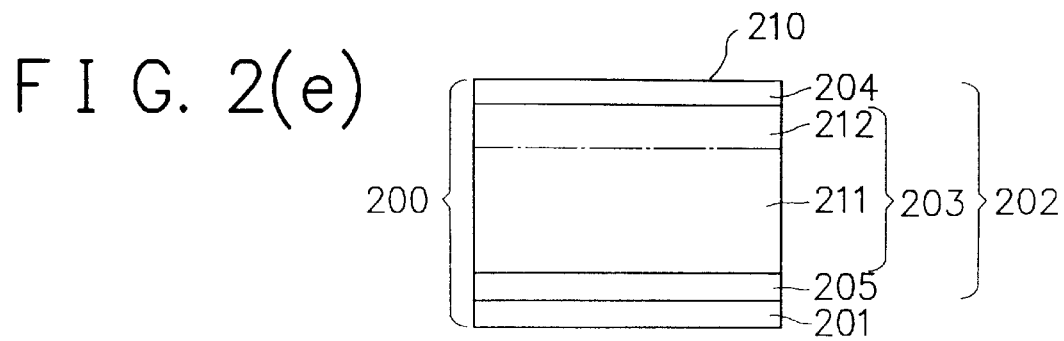

The surface layer 204 has a free surface 210 (see, FIGS. 2(d) and 2(e)). The surface layer 204 is disposed chiefly for the purpose of providing good effects with respect to moisture resistance, repetitive use characteristics, withstand voltage property, use-environmental characteristics and durability.

In the present invention, the amorphous materials of the photoconductive layer 203 and the surface layer 204 which constitute the light receiving layer 202 contain a common component comprising silicon atoms. Because of this, chemical stability is sufficiently ensured at the interface between the photoconductive layer and the surface layer.

The amorphous silicon material by which the surface layer 204 is constituted can include various amorphous silicon materials. Specific preferable examples of such amorphous silicon material are amorphous silicon material containing hydrogen atoms (H) or/and halogen atoms (X), and carbon atoms (C) (hereinafter referred to as a-SiC:H,X), amorphous silicon material containing hydrogen atoms (H) or/and halogen atoms (X), and oxygen atoms (O) (hereinafter referred to as a-SiO:H,X), amorphous silicon material containing hydrogen atoms (H) or/and halogen atoms (X), and nitrogen atoms (N) (hereinafter referred to as a-SiN:H,X), and amorphous silicon material containing hydrogen atoms (H) or/and halogen atoms (X), and atoms (C,O,N), i.e., at least one kind of atoms selected from the group consisting of carbon atoms (C), oxygen atoms (O) and nitrogen atoms (N) (hereinafter referred to as a-SiCON:H, X).

In the present invention, in order to effectively attain the object thereof, the surface layer 204 which is formed on the photoconductive layer 203 and which is a constituent of the light receiving layer 202 may be formed by means of a vacuum deposited film-forming process under numerical conditions of film formation parameters which are determined so as to cause the formation of a layer having desired properties as the surface layer.

Such vacuum deposited film-forming process can include glow discharge film-forming process such as A.C. glow discharge CVD such as low-frequency plasma CVD, high-frequency plasma CVD, or microwave plasma CVD, and D.C discharge CVD; sputtering; vacuum evaporation; ion plating; photo CVD; thermal-induced CVD; and the like.

These film-forming processes can be selectively used depending on the related factors such as manufacturing conditions, the degree of a load on capital investment in equipments, the manufacturing scale and properties desired for a light receiving member produced. However, it is desired to employ the same film-forming process by which the photoconductive layer is formed from the viewpoint of the productivity of a light receiving member.

Basically, for instance, when a surface layer 204 comprising an a-SiC:H,X is formed by the glow discharge film-forming process, a gaseous raw material capable of supplying silicon atoms (Si) (hereinafter referred to as Si-supplying raw material gas), a gaseous raw material capable of supplying carbon atoms (C) (hereinafter referred to as C-supplying raw material gas), and a gaseous raw material capable of supplying hydrogen atoms (H) (hereinafter referred to as H-supplying raw material gas) or/and a gaseous raw material capable of supplying halogen atoms (X) (hereinafter referred to as X-supplying raw material gas) are introduced into a deposition chamber capable of being vacuumed, where glow discharge is caused to form a layer comprising an a-SiC:H,X deposited film (as the surface layer 204) on the substrate 201 having the photoconductive layer 203 previously formed thereon positioned in the deposition chamber while maintaining the substrate at a desired temperature. In this case, if necessary, a gaseous raw material capable of supplying nitrogen atoms (N) or/and oxygen atoms (O) (hereinafter referred to as (N,O)-supplying raw material gas) may be additionally used. When the (N,O)-supplying raw material gas is additionally used, the resulting a-SiC:H,X film becomes to contain atoms (N,O).

As above described, in the present invention, as the constituent material of the surface layer 204, any silicon-containing amorphous material may be used. However, compounds with silicon atoms which contain at least one element selected from the group consisting carbon, nitrogen and oxygen are preferable, and compounds containing a-SiC as a main component are particularly preferable.

When the surface layer 204 comprises a-SiC as a main constituent, the carbon content is desired to be in the range of 30 to 90 atomic % versus the total amount of the silicon and carbon atoms.

The surface layer 204 in the present invention is necessary to contain hydrogen atoms (H) or/and halogen atoms (X) in addition to the silicon atoms (Si). The incorporation of the hydrogen atoms or/and halogen atoms into the surface layer is essential for compensating dangling bonds of the silicon atoms and also for improving the layer quality, particularly, the photoconductivity and charge retaining property.

For the amount of the hydrogen atoms (H) contained, it is desired to be preferably in the range of 30 to 70 atomic %, more preferably in the range of 35 to 65 atomic %, most preferably in the range of 40 to 60 atomic %, respectively versus the total amount of the constituent atoms. Similarly, for the amount of the halogen atoms (X) contained, it is desired to be preferably in the range of 0.01 to 15 atomic %, more preferably in the range of 0.1 to 10 atomic %, most preferably in the range of 0.6 to 4 atomic %, respectively versus the total amount of the constituent atoms.

The light receiving member comprising the surface layer with a hydrogen and/or halogen content within the above ranges formed on the foregoing photoconductive layer can be sufficiently put into practical use as an extremely excellent light receiving member hitherto unavailable.

Now, defects (mainly comprising dangling bonds of silicon atoms or those of carbon atoms) present in the surface layer of a light receiving member for use in electrophotography are known to entail negative effects on the properties of the light receiving member. Such negative effect deterioration in the charge performance due to charge injection from the free surface, changes in the charge performance due to changes in the surface structure in use environments with a high humidity for example, and occurrence of ghost phenomena during repeated use due to charge entrapping in the defects of the surface layer when charge is injected into the surface layer from the photoconductive layer at the time of corona charging or light irradiation.

However, the control of the hydrogen content of the surface layer to 30 atomic % or more significantly decreases the foregoing defects in the surface layer, resulting in a marked improvement in terms of the electrical chracteristics and high-speed continuous use characteristics in comparison with conventional light receiving members. In the case where the hydrogen content is less than 30 atomic %, this effect cannot be provided as desired. On the other hand, when the hydrogen content of the surface layer is beyond 70 atomic %, the hardness of the surface layer is decreased, where a problem is liable to entail in that the surface layer does not sufficiently endure against repeated use over a long period of time.

Hence, to control the hydrogen content of the surface layer within the above described range is one of very important factors for obtaining significantly superior electrophotographic characteristics as desired.

The hydrogen content of the surface layer can be controlled as desired by adequately controlling the related conditions, i.e., the flow rates (ratio) of raw material gases used, the substrate temperature, discharging power, gas pressure (inner pressure) in the deposition chamber, and the like upon the layer formation.

The control of the halogen (X) content of the surface layer within the range of 0.01 atomic % or more makes it possible to effectively generate bonds between the silicon and carbon atoms in the surface layer. The halogen atoms contained in the surface layer also function to effectively prevent the bonds between the silicon and carbon atoms from being broken due to damages caused by corona or the like. In the case where the halogen content is less than 0.01 atomic %, this effect cannot be provided as desired. On the other hand, when the halogen content of the surface layer is beyond 15 atomic 0%, there are substantially neither the effect of generating the bonds between the silicon and carbon atoms in the surface layer nor the effect of preventing the bonds between the silicon and carbon atoms from being broken due to the damages by corona. Moreover, the presence of halogen atoms in such an excessive amount in the surface layer hinders the carrier mobility (that is, the mobility of carriers) in the surface layer, and because of this, residual potential and image memory are liable to significantly occur.

Hence, to control the halogen content of the surface layer within the above described range is one of very important factors for obtaining desired electrophotographic characteristics.

The halogen content of the surface layer can be controlled as desired by adequately controlling the related conditions, i.e., the flow rates (ratio) of raw material gases used, the substrate temperature, discharging power, gas pressure (inner pressure) in the deposition chamber, and the like, as well as in the case of controlling the hydrogen content of the surface layer.

The foregoing Si-supplying raw material gas can include, for example, gaseous or gasifiable silicon hydrides (silanes) such as $SiH_4$, $Si_2H_6$, $Si_3H_8$, $Si_4H_{10}$, and the like. Of these, $SiH_4$ and $Si_2H_6$ are particularly preferred in view of the easy layer forming work and the good efficiency for the supply of Si. If necessary, these Si-supplying raw material gases may be used while being diluted with appropriate gas such as $H_2$ gas, He gas, Ar gas or Ne gas.

The foregoing C-supplying raw material gas can include, for example, gaseous or gasifiable hydrocarbons such as $CH_4$, $C_2H_2$, $C_2H_6$, $C_3H_8$, $C_4H_{10}$, and the like. Of these, $CH_4$, $C_2H_2$ and $C_2H_6$ are particularly preferred in view of the easy layer forming work and the good efficiency for the supply of C. If necessary, these C-supplying raw material gases may be used while being diluted with appropriate gas such as $H_2$ gas, He gas, Ar gas or Ne gas.

The foregoing (N,O)-supplying raw material gas can include, for example, gaseous or gasifiable atoms (N,O)-containing compounds such as $NH_3$, NO, $N_2O$, $NO_2$, $O_2$, CO, $CO_2$, $N_2$, and the like. These raw material gases may be used either singly or in combination of two or more of them. If necessary, these (N,O)-supplying raw material gases may be used while being diluted with appropriate gas such as $H_2$ gas, He gas, Ar gas or Ne gas.

In order to facilitate the introduction of the hydrogen atoms at a desired content into the surface layer 204 to be formed, upon the formation of the surface layer, it is desired that one or more of these (N,O)-supplying raw material gases are mixed with a desired amount of hydrogen gas or gas of a hydrogen-containing silicon compound. These (N,O)-supplying raw material gases be used either singly or in combination of two or more of them at an adequate mixing ratio.

The foregoing X-supplying raw material gas for introducing the halogen atoms (X) into the surface layer can include, for example, gaseous or gasifiable halogen compounds such as gaseous halogen, halides, inter-halogen compounds, and halogen-containing silicon compounds, i.e., halogen-substituted silane derivatives. Specific preferable examples are fluorine gas ($F_2$) and inter-halogen compounds such as BrF, ClF, $ClF_3$, $BrF_3$, $BrF_5$, $IF_3$, $IF_7$, and the like. Specific preferable example of the halogen-substituted silane derivative are silicon fluorides such as $SiF_4$, $Si_2F_6$, and the like.

To control the amount of the hydrogen atoms (H) or/and the halogen atoms (X) to be contained in the surface layer 204 may be conducted, for example, by properly controlling the temperature of the substrate 201, the amount of the H-supplying raw material gas or/and that of the X-supplying raw material gas to be introduced into the deposition chamber, or the discharging power, respectively upon the formation of a deposited film as the surface layer 204.

For the atoms (C,N,O) (that is, at least one kind of atoms selected from the group consisting of carbon atoms (C), nitrogen atoms (N) and oxygen atoms (O)) contained in the surface layer 204, it is possible for the atoms (C,N,O) to be contained in the surface such that they are uniformly distributed in the entire layer region or they are unevenly distributed in the layer thickness direction in a partial layer region.

In the present invention, if necessary, the surface layer 204 may contain atoms of an element capable controlling the conductivity (this element will be hereinafter referred to as conductivity controlling element). In this case, atoms of a given conductivity controlling element may be contained in the surface layer such that they are uniformly distributed in the entire layer region or they are unevenly distributed in the layer thickness direction in a partial layer region.

The conductivity controlling element can include so-called impurities in the field of semiconductor. Specifically, the conductivity controlling element can include elements capable of imparting p-type conductivity which belong to group IIIb of the periodic table (this element will be hereinafter referred to as group IIIb element) and elements capable of imparting n-type conductivity which belong to group Vb of the periodic table (this element will be hereinafter referred to as group Vb element).

Specific examples of the group IIIb element are boron (B), aluminum (Al), gallium (Ga), indium (In), and thallium (Tl). Of these, B, Al and Ga are particularly preferred.

Specific examples of the group Vb element are phosphorous (P), arsenic (As), antimony (Sb), and bismuth (Bi). Of these, P and As are particularly preferred.

The amount of the atoms of a given conductivity controlling element selected from those above mentioned (this atoms will be hereinafter referred to as conductivity controlling atoms ) contained in the surface layer is desired to be preferably in the range of $1\times10^{-3}$ to $1\times10^3$ atomic ppm, more preferably in the range of $1\times10^{-2}$ to $5\times10^2$ atomic ppm, most preferably in the range of $1\times10^{-1}$ to $1\times10^2$ atomic ppm.

In order to structurally introduce the conductivity controlling atoms, i.e., the group IIIb atoms or the group Vb atoms, into the surface layer 204, a raw material gas capable of supplying group IIIb or Vb atoms is introduced into the deposition chamber together with other raw material gases for the formation of the surface layer upon the formation of a deposited film as the surface layer.

As the raw material gas capable of supplying the group IIIb or Vb atoms, those which are in the gaseous state at room temperature and normal pressure or can be easily gasified at least under conditions for the formation of the surface layer may be selectively used.

The raw material gas capable of supplying the group IIIb atoms can include boron hydrides such as $B_2H_6$, $B_4H_{10}$, $B_5H_9$, $B_5H_{11}$, $B_6H_{10}$, $B_6H_{12}$, and $B_6H_{14}$, and boron halides such as $BF_3$, $BCl_3$, and $BBr_3$, which can supply boron atoms. Besides, it can include $AlCl_3$, $GaCl_3$, $Ga(CH_3)_3$, $InCl_3$, and $TlCl_3$.

The raw material gas capable of supplying the group Vb atoms can include phosphorous hydrides such as $PH_3$, and $P_2H_4$, phosphorous halides such as $PH_4I$, $PF_3$, $PF_5$, $PCl_3$, $PCl_5$, $PBr_3$, $PBr_5$, and $PI_3$, which can supply phosphorous atoms. Besides, it can include $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$ and $BiBr_3$.

These raw material gases used for introducing the conductivity controlling atoms into the surface layer may be diluted with appropriate gas such as $H_2$ gas, He gas, Ar gas, or Ne gas, if necessary.

For the thickness of the surface layer 204 in the present invention, it is preferably in the range of 0.01 to 3 μm, more preferably in the range of 0.05 to 2 μm, most preferably in the range of 0.1 to 1 μm. When the thickness is less than 0.01 μm, a problem is liable to entail in that the surface layer is sometimes lost due to abrasion or the like during the repeated use of the light receiving member. When the thickness is beyond 3 μm, a problem is liable to entail in that deterioration in the electrophotographic characteristics such as an increase in the residual potential occurs.

In the present invention, the surface layer 204 is carefully formed so that the characteristics required therefor can be obtained as desired. Particularly, the material (by which the surface layer is constituted) comprising silicon atoms, atoms (C,N,O) (that is, at least one kind of atoms selected from the group consisting of carbon atoms (C), nitrogen atoms (N) and oxygen atoms (O)), and hydrogen atoms (H) and/or halogen atoms (X) as the constituent elements takes a structural form varying from crystalline structure to amorphous structure depending upon the layer-forming conditions employed, where it exhibits electric and physical properties varying from conductive property to semiconductive and insulative properties, and also properties varying from photoconductive property to non-photoconductive property. Accordingly, in the present invention, the conditions for forming the surface layer are severely selected as desired so that a compound having the desired properties which satisfy aimed requirements can be obtained.

For instance, in the case where the surface layer 204 is provided mainly for the purpose of improving the withstand voltage property, it is constituted by a non-single crystal material which exhibits remarkable electrically insulative behavior in severe use-environments. In the case where the surface layer 204 is provided mainly for the purpose of improving the continuous and repetitive use characteristics and use-environment characteristics, it is constituted by a non-single crystal material having the electrically insulative properties lowered to some extent and a certain degree of sensitivity to light irradiated thereto.

In order for the surface layer 204 to be formed to have the desired properties, at least the gas pressure in the deposition chamber and the substrate temperature are necessary to be adequately controlled upon the formation of the surface layer.

For the substrate temperature (Ts), it should be properly determined within an optimum range in accordance with the design of the layer. However, in general, it is preferably in the range of 200 to 350° C., more preferably in the range of 230 to 330° C., most preferably in the range of 250 to 300° C.

For the gas pressure in the deposition chamber, it should be also properly determined within an optimum range in accordance with the design of the layer. However, in general, it is preferably in the range of $1 \times 10^{-4}$ to 10 Torr (in the range of $1.333 \times 10^{-2}$ to $1.333 \times 10^{3}$ Pa), more preferably in the range of $5 \times 10^{-4}$ to 5 Torr (in the range of $6.665 \times 10^{-1}$ to $6.665 \times 10^{2}$ Pa), most preferably in the range of $1 \times 10^{-3}$ to 1 Torr (in the range of $1.333 \times 10^{-1}$ to $1.333 \times 10^{2}$ Pa).

The conditions for the formation of the surface layer of the present invention are determined within the above described ranges. However, the actual conditions such as the substrate temperature and the gas pressure in the deposition chamber cannot usually be determined with ease independent of each other. Accordingly, the conditions optimum to the layer formation are desired to be properly determined based on relative and organic relationships for forming the surface layer having the desired properties.

Separately, in the present invention, it is possible to dispose a blocking layer (or a lower surface layer) comprising a non-single crystal material similar to the constituent non-single crystal material of the surface layer and which has a lower content of the atoms (C,N,O) than the surface layer between the photoconductive layer and the surface layer. The blocking layer provided in this way is effective in further improving the characteristics including the charge retentivity.

Besides, in the present invention, between the surface layer 204 and the photoconductive layer 203, it is possible to dispose a layer region in which the content of the atoms (C,N,O) is changed to decrease toward the the photoconductive layer 203. This provides advantages in that the adhesion between the surface layer and the photoconductive layer is improved, photocarriers become to smoothly mobilize toward the surface, and the influence of interference due to light reflected at the interface between the photoconductive layer and the surface layer is decreased.

In addition, if necessary, on the surface layer 204, it is possible to dispose a separate surface layer constituted by an amorphous carbon material for example.

Charge Injection Inhibition Layer In the light receiving member according to the present invention, it is more effective to dispose, between the substrate 201 and the photoconductive layer 203, a charge injection inhibition layer 205 (constituted by a non-single crystal silicon material containing at least hydrogen atoms and/or halogen atoms, and atoms of a conductivity controlling element) capable of preventing a charge from injecting into the photoconductive layer from the substrate side. The charge injection inhibition layer 205 has a so-called polarity-dependent property such that it functions to prevent a charge from injecting into the photoconductive layer from the substrate side when the free surface 210 of the light receiving layer 202 is subjected to charging with a certain polarity, and it exhibits no such function when subjected to charging with a reverse polarity. In order for the charge injection inhibition layer to have such property as above described, atoms of an appropriate element capable of controlling the conductivity (the atoms will be hereinafter referred to as conductivity controlling atoms) are contained in the charge injection inhibition layer in a relatively large amount in comparison with that of the conductivity controlling atoms to be optionally contained in the photoconductive layer.

The conductivity controlling atoms may be contained in the charge injection inhibition layer such that they are uniformly distributed in the entire layer region or they are unevenly distributed in the layer thickness direction in a partial layer region. In the latter case where the distribution concentration of the conductivity controlling atoms is uneven, it is desired for the conductivity controlling atoms to be largely distributed on the side of the substrate. However, in any case, in order to uniform the properties in the in-plane direction parallel to the surface of the substrate, it is necessary for the conductivity controlling atoms to be evenly contained at a uniform concentration distribution in the in-plane direction.

The foregoing element capable of controlling the conductivity (hereinafter referred to as conductivity controlling element) can include so-called impurities in the field of semiconductor. Specifically, the conductivity controlling element can include elements capable of imparting p-type conductivity which belong to group IIIb of the periodic table (this element will be hereinafter referred to as group IIIb element) and elements capable of imparting n-type conductivity which belong to group Vb of the periodic table (this element will be hereinafter referred to as group Vb element).

Specific examples of the group IIIb element are boron (B), aluminum (Al), gallium (Ga), indium (In), and thallium (Tl). Of these, B, Al and Ga are particularly preferred.

Specific examples of the group Vb element are phosphorous (P), arsenic (As), antimony (Sb), and bismuth (Bi). Of these, P and As are particularly preferred.

The amount of the atoms of a given conductivity controlling element selected from those above mentioned (this atoms will be hereinafter referred to as conductivity controlling atoms) contained in the charge injection inhibition layer should be adequately determined depending upon the situation involved. However, in general, it is preferably in the range of 10 to to $1 \times 10^4$ atomic ppm, more preferably in the range of 50 to $5 \times 10^3$ atomic ppm, most preferably in the range of $1 \times 10^2$ to $3 \times 10^3$ atomic ppm.

In order to further improve the adhesion between the charge injection inhibition layer and other layer provided in direct contact therewith, it is possible for the charge injection inhibition layer to contain at least one kind of atoms selected from the group consisting of carbon atoms (C), nitrogen atoms (N) and oxygen atoms (O) (this atoms will be hereinafter referred to as atoms (C,N,O)).

The atoms (C,N,O) may be contained in the charge injection inhibition layer such that they are uniformly distributed in the entire layer region or they are unevenly distributed in the layer thickness direction in a partial layer region. However, in any case, in order to uniform the properties in the in-plane direction parallel to the surface of the substrate, it is necessary for the atoms (C,N,O) to be evenly contained at a uniform concentration distribution in the in-plane direction.

The amount of the atoms (C,N,O) contained in the charge injection inhibition layer should be adequately determined depending upon the situation involved. However, in general, it is preferably in the range of $1 \times 10^{-3}$ to 30 atomic %, more prferably in the range of $5 \times 10^{-3}$ to 20 atomic %, most preferably in the range of $1 \times 10^{-2}$ to 10 atomic %.

The hydrogen atoms and/or halogen atoms contained in the charge injection inhibition layer 205 serve to compensate dangling bonds present in the layer whereby improving the quality of the layer constituent material.

The amount of the hydrogen atoms or the halogen atoms contained in the charge injection injection layer or the total amount of the hydrogen and halogen atoms is preferably in the range of 1 to 50 atomic %, more preferably in the range of 5 to 40 atomic %, most preferably in the range of 10 to 30 atomic %.

The thickness of the charge injection inhibition layer 205 should be adequately determined from the viewpoints of achievement of the desired electrophotographic characteristics and of economical effects. However, in general, it is preferably in the range of 0.1 to 5 $\mu$m, more preferably in the range of 0.3 to 4 $\mu$, most preferably in the range of 0.5 to 3 $\mu$m. When the thickness is less than 0.1 $\mu$m, a problem is liable to entail in that the function of preventing charge injection from the substrate side becomes insufficient, where the charge retentivity becomes insufficient accordingly. When the thickness is beyond 5 $\mu$m, a problem is liable to entail in that a desired improvement in the electrophotographic characteristics cannot be expected, and the period of time for the layer formation is prolonged to result in an increase in the production cost of a light receiving member.

The charge injection inhibition layer 205 may be formed by the same vacuum deposition process employed in the formation of the photoconductive layer 203.

In order to form the charge injection inhibition layer 205 having the desired properties, as well as in the case of forming the photoconductive layer 203, the related parameters such as the mixing ratio between the Si-supplying raw material gas and dilution gas, the gas pressure in the deposition chamber, the discharging power and the substrate temperature are adequately controlled upon the formation of the charge injection inhibition layer.

For the flow rate of $H_2$ gas and/or He gas used as the dilution gas, it should be properly determined within an optimum range in accordance with the design of the layer. However, in general, it is desired to be controlled preferably in the range of 0.3 to 20 times, more preferably in the range of 0.5 to 15 times, most preferably in the range of 1 to 10 times, respectively over the flow rate of the Si-supplying raw material gas.

For the gas pressure in the deposition chamber, it should be also properly determined within an optimum range in accordance with the design of the layer. However, in general, it is preferably in the range of $1 \times 10^{-4}$ to 10 Torr (in the range of $1.333 \times 10^{-2}$ to $1.333 \times 10^3$ Pa), more preferably in the range of $5 \times 10^{-4}$ to 5 Torr (in the range of $6.665 \times 10^{-1}$ to $6.665 \times 10^2$ Pa), most preferably in the range of $1 \times 10^{-3}$ to 1 Torr (in the range of $1.333 \times 10^{-1}$ to $1.333 \times 10^2$ Pa).

For the discharging power, it should be also properly determined within an optimum range in accordance with the design of the layer. However, in general, the ratio (W/cc) of discharging power to the flow rate of the Si-supplying raw material gas is desired to be preferably in the range of 0.5 to 8, more preferably in the range of 0.8 to 7, most preferably in the range of 1 to 6.

For the substrate temperature (Ts), it should be also properly determined within an optimum range in accordance with the design of the layer. However, in general, it is preferably in the range of 200 to 350° C., more preferably in the range of 230 to 330° C., most preferably in the range of 250 to 300° C.

The conditions for the formation of the charge injection inhibition layer of the present invention are determined within the above described ranges. However, the actual conditions such as the mixing ratio of the dilution gas, the gas pressure in the deposition chamber, the discharging power, and the substrate temperature cannot usually be determined with ease independent of each other. Accordingly, the conditions optimum to the layer formation are desired to be properly determined based on relative and organic relationships for forming the charge injection inhibition layer having the desired properties.

Separately, the light receiving member according to the present invention is desired to have a layer region on the substrate 201 side of the light receiving layer 202, containing aluminum atoms, silicon atoms, and at least one kind of atoms selected from the group consisting of hydrogen atoms and halogen atoms such that they are unevenly distributed in the layer thickness direction.

Further, in the light receiving member according to the present invention, a contact layer constituted by amorphous material containing, for example, $Si_3N_4$, $SiO_2$, SiO or silicon atoms as a matrix, at least one kind of atoms selected from the group consisting of hydrogen atoms and halogen atoms, and at least one kind of atoms selected from carbon atoms, oxygen atoms and nitrogen atoms may be disposed, in order to further improve the adhesion between the substrate 201 and the photoconductive layer 203 or between the substrate 201 and the charge injection inhibition layer 205.

Fabrication Apparatus and Film-Forming Method

Description will be made of an example of a fabrication apparatus for producing a light receiving member according to the present invention and a film-forming method for forming a light receiving layer according to the present invention.

Figure 3:
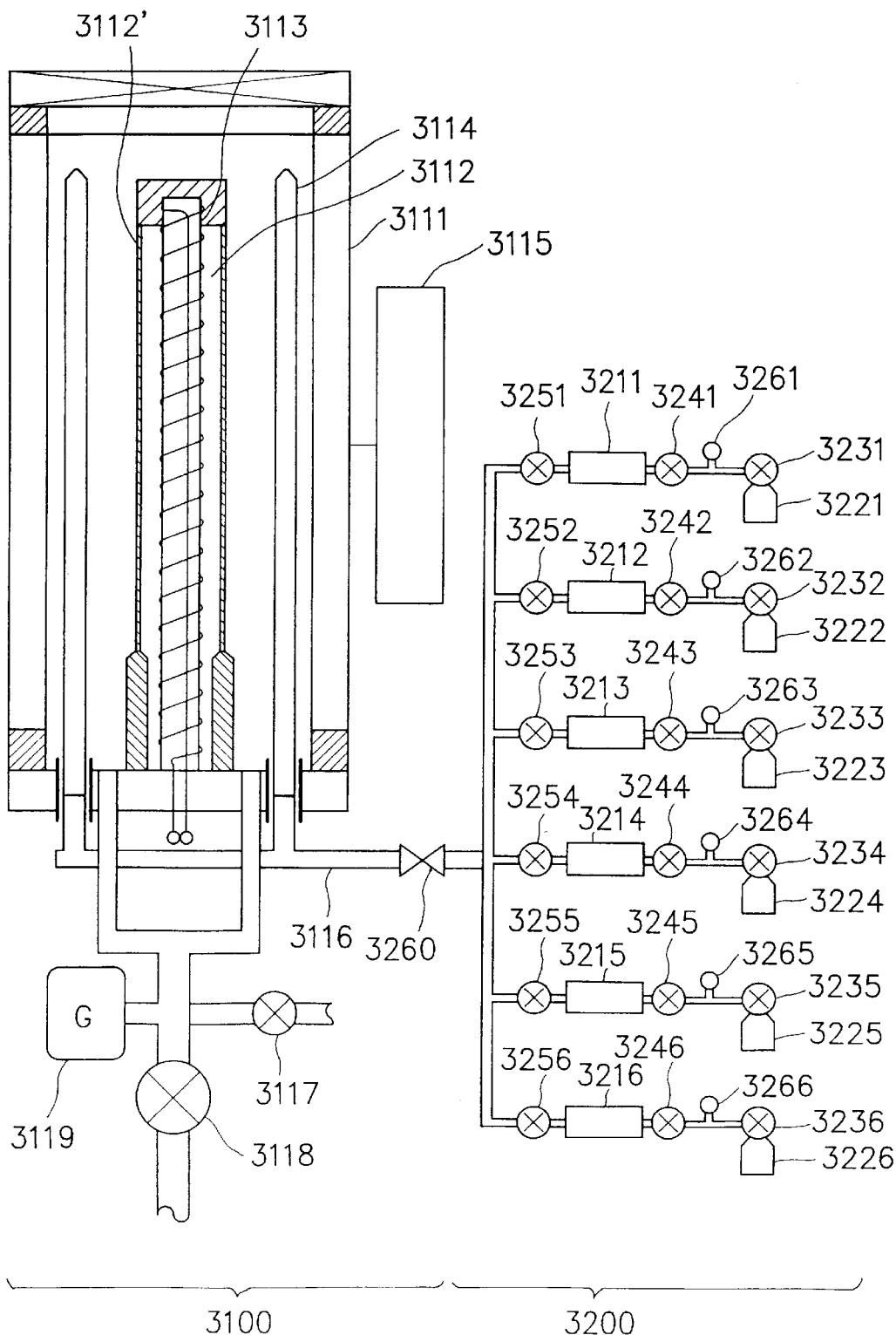
FIG. 3 is a schematic diagram illustrating an example of a plasma CVD apparatus for producing a light receiving member according to the present invention.

FIG. 3 is a schematic diagram illustrating an example of a fabrication apparatus for producing a light receiving member according to the present invention by a high frequency plasma CVD process using a high frequency with RF band (this fabrication apparatus will be hereinafter referred to as RF plasma CVD apparatus).

The RF plasma CVD apparatus shown in FIG. 3 comprises a deposition system 3100 (having a reaction chamber 3111 (or a deposition chamber) capable of being vacuumed), a raw material gas supply system 3200, and an exhaust system containing an exhaust pipe which is open into the reaction chamber 3111 and which is connected through a main valve 3118 to a vacuuming device (not shown).

The deposition chamber 3111 of the deposition system 3100 contains a substrate holder 3112 having an electric heater 3113 installed therein for heating a substrate 3112' in a cylindrical form positioned on the substrate holder 3112, and gas feed pipes 3114 for supplying a raw material gas into the deposition chamber. Reference numeral 3115 indicates a matching box which is coupled to the deposition chamber 3111. The matching box 3115 is electrically connected to a high frequency power source (not shown).

The raw material gas supply system 3200 comprises gas reservoirs 3221 to 3226 respectively containing a raw material gas, for example, $SiH_4$, $GeH_4$, $H_2$, $CH_4$, $B_2H_6$, or $PH_3$, valves 3231 to 3236 for the gas reservoirs 3221 to 3226, inlet valves 3241 to 3246, exit valves 3251 to 3256, and mass flow controllers 3211 to 3216. Reference numerals 3261 to 3266 indicate each a pressure controller. Reference numeral 3260 indicates a sub-valve disposed at a conduit 3116 extending from the gas supply system 3200 and which is communicated with each of the gas feed pipes 3114. Reference numeral 3117 indicates a leak valve. Reference numeral 3119 indicates a vacuum gauge.

Film formation in the FR plasma CVD apparatus shown in FIG. 3 may be conducted, for example, in the following manner.

First, a cylindrical substrate 3112' is positioned on the substrate holder 3112 in the deposition chamber 3111, followed by provisionally evacuating the inside of the deposition chamber 3111 by means of the vacuuming device (for instance, a vacuuming pump (not shown)). Then, the cylindrical substrate 3112' is heated to and maintained at a desired temperature of 200 to 350° C. by means of the electric heater 3113.

Prior to the entrance of film-forming raw material gases into the deposition chamber 3111, it is confirmed that the valves 3231 to 3236 for the gas reservoirs 3221 to 3226 and the leak valve 3117 are closed and that the inlet valves 3241 to 3246, the exit valves 3251 to 3256, and the sub-valve 3260 are opened. Then, the main valve 3118 is opened to evacuate the inside of the deposition chamber 3111 and the inside of the conduit 3116.

Successively, upon observing that the reading on the vacuum gauge 3119 became about $5 \times 10^{-6}$ Torr, the sub-valve 3260 and the exit valves 3251 to 3256 are closed.

Thereafter, the valves 3231 to 3236 are opened to introduce the respective raw material gases from the gas reservoirs 3221 to 3226, and the pressures of the raw material gases are respectively controlled to 2 Kg/cm 2 by the pressure controllers 3261. Then, the inlet valves 3241 to 3246 are gradually opened to introduce the raw material gases into the mass flow controllers 3211 to 3216.

After the preparation for film formation has been completed, the formation of each layer is conducted as will be described below.

When the cylindrical substrate 3112' became constant at a desired temperature, necessary ones of the exit valves 3251 to 3256 and the sub-valve 3260 are gradually opened to introduce predetermined raw material gases from the gas reservoirs 3221 to 3226 into the deposition chamber 3111 through the gas feed pipes 3114. Then, the raw material gases are respectively controlled to predetermined flow rates by the mass flow controllers 3211 to 3216. At the same time, the opening of the main valve 3118 is controlled so that the inner pressure of the deposition chamber 3111 is a vacuum degree of less than 1 Torr, while watching the vacuum gauge 3119. When the inner pressure of the deposition chamber 3111 became stable, the high frequency power source (not shown) with an oscillation frequency of 13.56 MHz is switched on to supply an RF power of a desired wattage into the deposition chamber 3111 through the matching box 3115, whereby causing glow discharge, where the raw material gases introduced therein are decomposed by the discharge energy to deposite a desired film containing silicon atoms as a main component on the cylindrical substrate 3112'. After the formation of the deposited film at a desired thickness, the introduction of the RF power was suspended, the exit valves are closed to stop the raw material gases from flowing into the deposition chamber. The formation of the deposited film is thus completed.

By repeating the above film-forming procedures several times, there can be formed a light receiving member having a multi-layered structure as desired.

When each of the layers is formed, it is a matter of course that the exit valves other than those for necessary raw material gases are closed. In addition, in order to prevent the raw material gases from remaining in the deposition chamber 3111 and in the piping extending from the exit valves 3251 to 3256 to the deposition chamber 3111, the exit valves 3251 to 3256 are closed, the sub-valve 3260 is opened, and the main valve 3118 is fully opened, to evacuate the inside of the system to a high vacuum degree, if necessary.

In order to form a deposited film having a uniform thickness, it is possible to rotate the substrate 3112' at a desired speed by means of a driving means (not shown) during the formation of the film.

The above described raw material gases and the valve operations, of course, can be changed depending upon the conditions employed for the formation of each layer.

In the following, the present invention will be described in more detail with reference to examples. It should be understood that these examples are only for illustrative purposes and they are not intended to restrict the scope of the present invention.

EXAMPLE 1

1. A glass substrate comprising a No. 7059 Glass Plate (produced by Corning Glass Works) and a Si wafer were positioned on a grooved cylindrical sample holder for installing a sample substrate, which was set in the RF plasma CVD apparatus shown in FIG. 3 as the cylindrical substrate holder. And in accordance with the foregoing film-forming manner using the RF plasma CVD apparatus shown in FIG. 3 and under photoconductive layer-forming conditions shown Table 1, an about 1 um thick a-Si deposited film comprising a first layer region and a second layer region stacked in this order from the substrate side was formed on each of the glass substrate and the Si wafer.

For the a-Si deposited film formed on the glass substrate, optical band gap (Eg) was measured by spectrophotometry. Successively, a Cr comb-like shaped electrode was formed on the a-Si deposited film, followed by measuring characteristic energy (Eu) of the potential tail by CPM (constant photocurrent method).

For the a-Si deposited film formed on the Si wafer, hydrogen content (Ch) was measured by FTIR (Fourier transformation infrared absorption spectroscopy).

As a result, the first layer region was found to have a hydrogen content (Ch) of 23 atomic %, an optical band gap (Eg) of 1.77 eV, and a characteristic energy (Eu) of 60 meV. And the second layer region was found to have a hydrogen content (Ch) of 18 atomic %, an optical band gap (Eg) of 1.73 eV, and a characteristic energy (Eu) of 53 meV.

2. There were provided a plurality of cylindrical aluminum substrates of 30 mm in outer diameter having a mirror-finished surface and a plurality of cylindrical aluminum substrates of 80 mm in outer diameter having a mirror-finished surface.

Each of these cylindrical substrate was positioned on the cylindrical substrate holder of the RF plasma CVD apparatus shown in FIG. 3. And in accordance with the foregoing film-forming manner using the RF plasma CVD apparatus shown in FIG. 3 and under film-forming conditions shown in Table 1, a charge injection inhibition layer, a photoconductive layer and a surface layer were formed in the named order on the cylindrical substrate, wherein as the photoconductive layer, a 28 μm thick first layer region was formed on the substrate side and a second layer region having a thickness capable of absorbing 80 to 95% of light with a wavelength of 680 nm was formed on the surface layer side. In the formation of the second layer region of the photoconductive layer in each case, the mixing ratio between the SiH$_4$ gas and the H$_2$ gas, the ratio between the SiH$_4$ gas and the discharging RF power, and the substrate temperature were varied so that the second layer region had a different optical band gap (Eg) and a different characteristic energy (Eu). And the second layer region was made to have a thickness of 2 μm.

In this way, there were prepared (a) a plurality of light receiving members each having the cylindrical aluminum substrates of 30 mm in outer diameter and being different with respect to the Eg and Eu of the second layer region and (b) a plurality of light receiving members each having the cylindrical aluminum substrates of 80 mm in outer diameter and being different with respect to the Eg and Eu of the second layer region.

Evaluation

Each of the resultant light receiving members (b) was set to a modification of an electrophotographic apparatus NP 6550 produced by CANON Kabushiki Kaisha (modified for experimental purposes) in which the process speed can be made to be 380 mm/sec, the pre-exposure can be conducted at 4 lux.sec by LED with a wavelength of 700 nm, and the image exposure can be conducted by LED with a wavelength of 680 nm or by light from a halogen lamp, where evaluation was conducted with respect to potential characteristics, i.e., temperature-dependent property with respect to sensitivity, sensitivity-linearity, and charge retentivity as will be described below.

The surface potential of the light receiving member was measured by a potential sensor of a surface potentiometer Model 344 (produced by TREK Company) set at the position of the development unit of the electrophotographic apparatus under conditions in which the process speed was 380 mm/sec, pre-exposure light (the LED with a wavelength of 700 nm) was 4 lux.sec, and the charging wire current of the charger was 1000 uA. The measured result was considered as the charge retentivity.

The temperature of the light receiving member was changed from room temperature (about 25° C.) to 50° C. by the drum heater installed in the light receiving member, at which the charge retentivity was measured under the above conditions. A change in the charge retentivity per 1° C. temperature change was considered as the temperature-dependent property.

In order to evaluate the exposure memory, using a halogen lamp as the image exposure light source, the surface potential was measured by the same potential sensor as above described under the above conditions in an unexposed state, followed by re-charging the light receiving member having been once subjected to exposure, where a potential difference was measured.

For the temperature-dependent sensitivity, it was evaluated in the following manner. For the case where the light receiving member was maintained at room temperature and the case where the light receiving member was maintained at 50° C., the exposure value in the former was compared with that in the latter when the surface potential was made to be 200 V. A difference between the two exposure values was made to be an absolute value as the temperature-dependent sensitivity. This situation is graphically shown in FIG. 12.

For the sensitivity linearity, the curve of the exposure value at a set voltage/350 and the curve of the exposure value at a set voltage/200 were extraporated to obtain a difference between the two curves. The resultant difference was made to be an absolute value as the sensitivity linearity. This situation is also graphically shown in FIG. 12.

Then, each of the light receiving members was set to a modification of an electrophographic apparatus CLC 200 (in visible laser of 680 nm is used) produced by CANON Kabushiki Kaisha (modified for experimental purposes), where temperature-dependent sensitivity, sensitivity linearity, and image-forming performance were evaluated.

For the resultant light receiving members (a), each of them was evaluated with respect to image-forming performance (with respect to occurrence of interference fringe pattern) using a modification of an electrophotographic apparatus GP 55 produced by CANON Kabushiki Kaisha (modified for experimental purposes).

Figure 4:
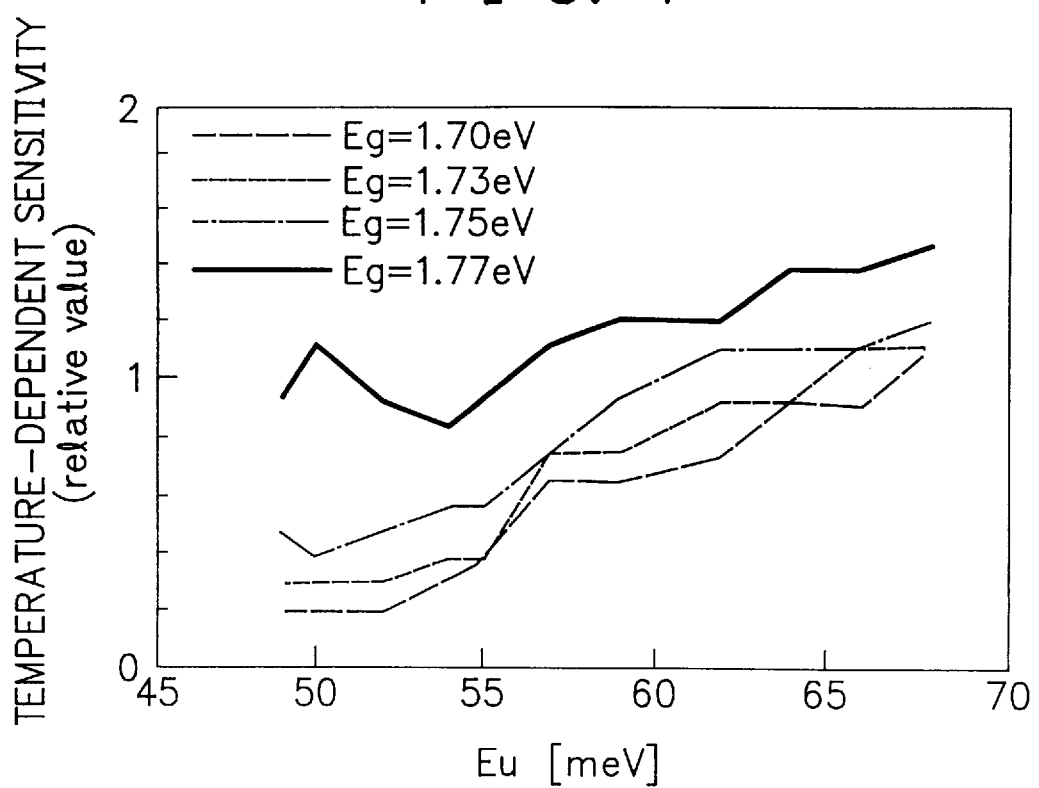
FIG. 4 is a graph showing interrelations between chracteristic energy (Eu) at Urback tail (or exponential tail obtained from light absorption spectrum) and temperature-dependent sensitivity for a given second layer region of the photoconductive layer, which were obtained in the present invention.
Figure 5:
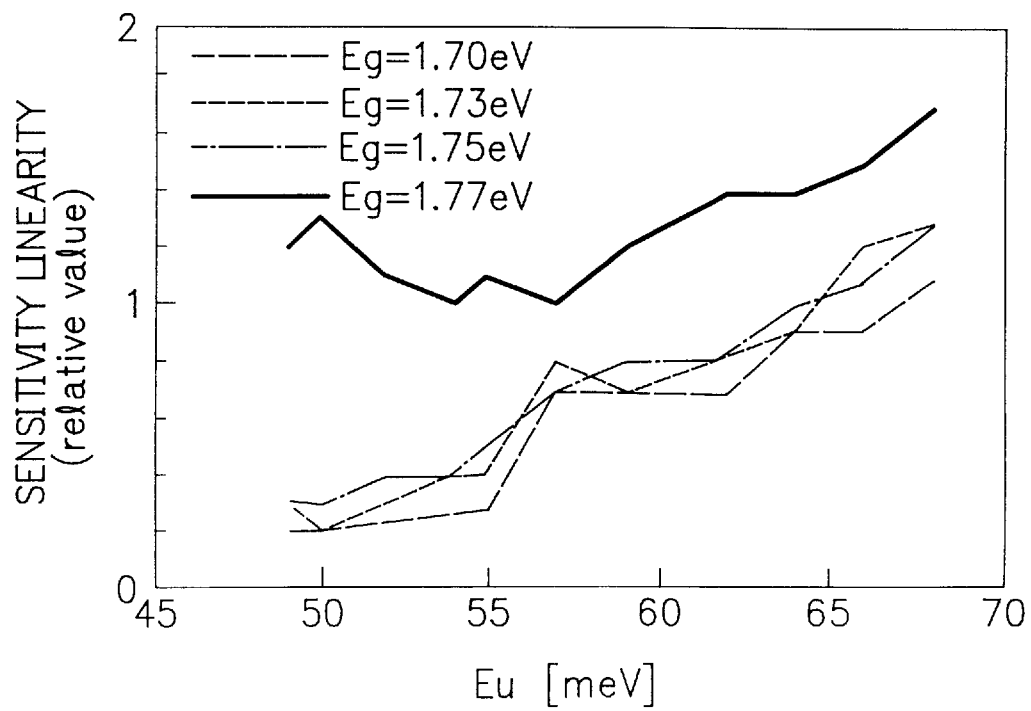
FIG. 5 is a graph showing interrelations between chracteristic energy (Eu) at Urback tail and sensitivity linearity for a given second layer region of the photoconductive layer, which were obtained in the present invention.
Figure 6A:
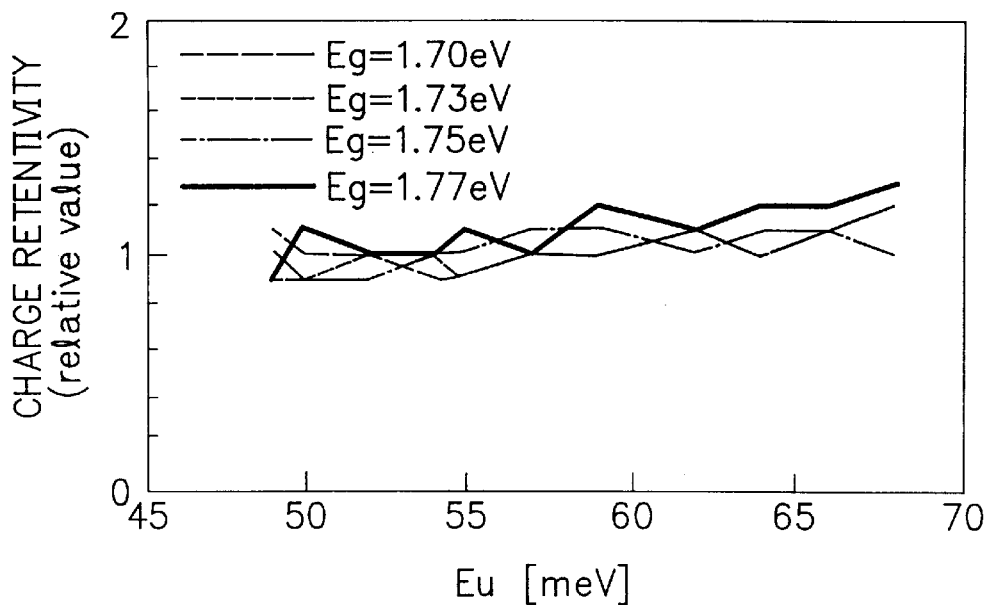
FIG. 6(A) is a graph showing interrelations between chracteristic energy (Eu) at Urback tail and charge retentivity for a given second layer region (of the photoconductive layer) positioned on the surface side, which were obtained in the present invention.
Figure 7A:
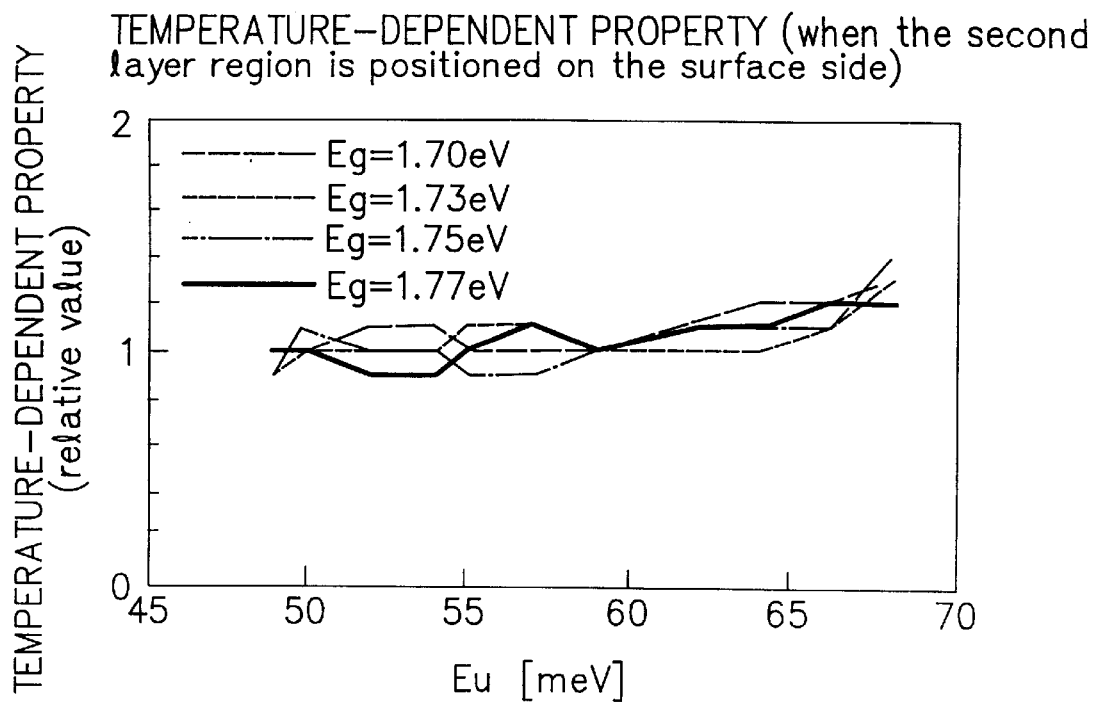
FIG. 7(A) is a graph showing interrelations between chracteristic energy (Eu) at Urback tail and temperature-dependent property for a given second layer region (of the photoconductive layer) positioned on the surface side, which were obtained in the present invention.
Figure 8A:
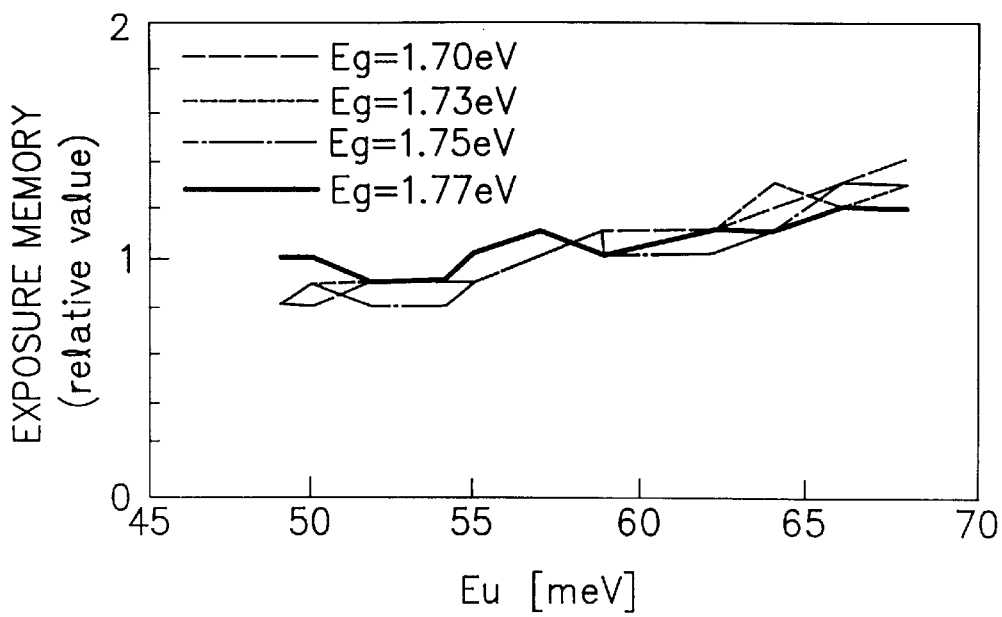
FIG. 8(A) is a graph showing interrelations between chracteristic energy (Eu) at Urback tail and exposure memory for a given second layer region (of the photoconductive layer) positioned on the surface side, which were obtained in the present invention.
Figure 9:
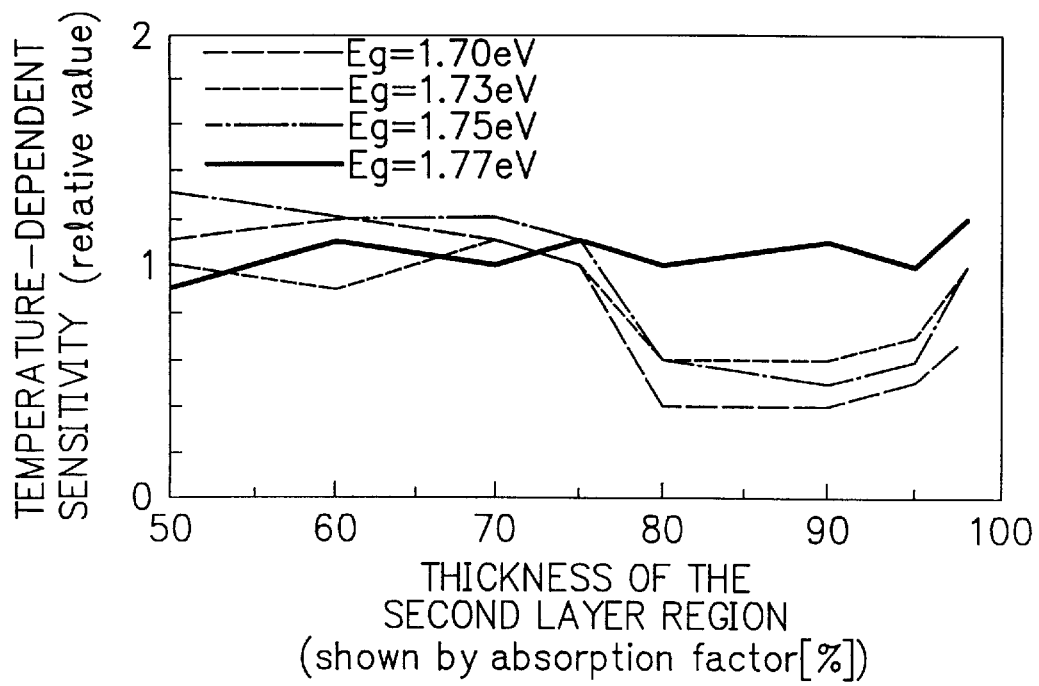
FIG. 9 is a graph showing interrelations between the thickness of a given second layer region (of the photoconductive layer) determined based on the absorption factor of a prescribed exposure value and the temperature-dependent sensitivity, which were obtained in the present invention.
Figure 10:
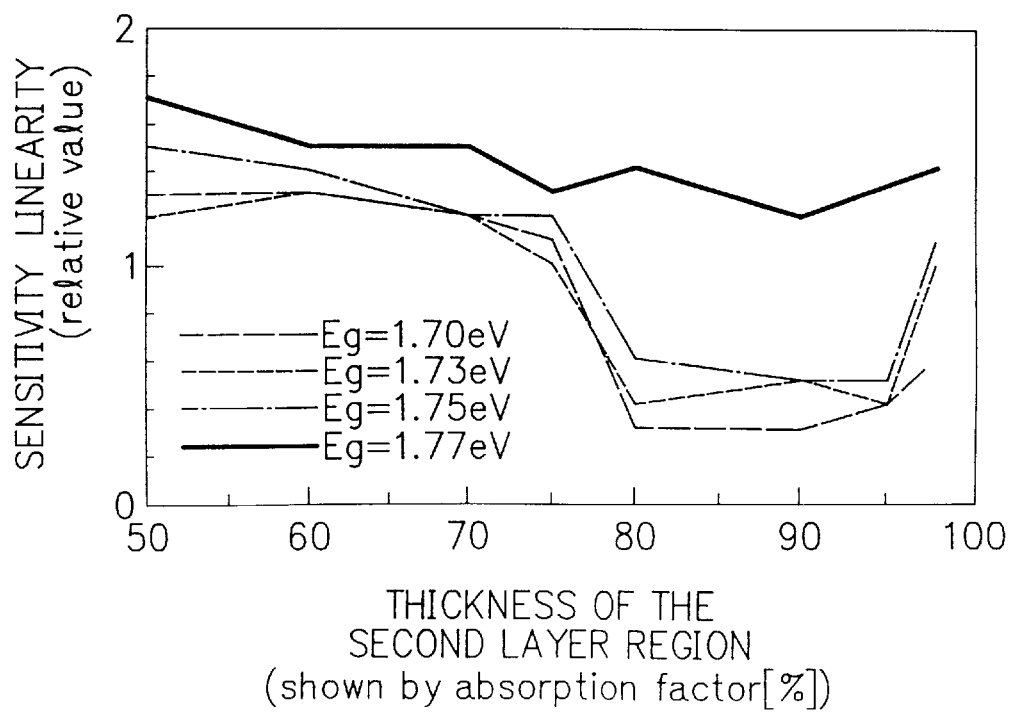
FIG. 10 is a graph showing interrelations between the thickness of a given second layer region (of the photoconductive layer) determined based on the absorption factor of a prescribed exposure value and the sensitivity-linearity.

The evaluated results obtained in the above are graphically shown in FIGS. 4, 5, 6(A), 7(A), 8(A), 9 and 10. Particularly, FIG. 4 shows the interrelations between different Eu values and temperature-dependent sensitivities. FIG. 5 shows the interrelations between different Eu values and sensitivity linearities. FIG. 6(A) shows the interrelations between different Eu values and charge retentivities. FIG. 7(A) shows the interrelations between different Eu values and temperature-dependent properties. FIG. 8(A) shows the interrelations between different Eu values and exposure memories. FIG. 9 shows the interrelations between different thicknesses of the second layer region and temperature-dependent sensitivities. FIG. 10 shows the interrelations between different thicknesses and sensitivity linearities.

The characteristic's values in each of these figures are values relative to the corresponding value obtained when the photoconductive layer of 30 um in total thickness was constituted by the first layer region only, which is set at 1.

Based on the results shown in FIGS. 4, 5, 6(A), 7(A), 8(A), 9, 10, and 12 there were obtained the following facts. When the second layer region of the photoconductive layer is made to have a thickness having an optical band gap in the range of 1.65 to 1.75 eV, a characteristic energy (Eu) of the potential tail in the range of 45 to 55 meV and which is capable of absorbing 80 to 95% of image exposure light, there is attained a desirable light receiving member which is good enough in temperature-dependent sensitivity and sensitivity linearity and which is also good enough in charge retentivity, temperature-dependent property, and exposure memory. And the light receiving member provides a desirable image with no interference fringe pattern even in the case of using visible laser.

EXAMPLE 2

There were provided a plurality of cylindrical aluminum substrates of 30 mm in outer diameter having a mirror-finished surface and a plurality of cylindrical aluminum substrates of 80 mm in outer diameter having a mirror-finished surface.

Each of these cylindrical substrate was positioned on the cylindrical substrate holder of the RF plasma CVD apparatus shown in FIG. 3. And in accordance with the procedures of Example 1 for the preparation of a light receiving member except for reversing the position of the first layer region and that of the second layer region, a charge injection inhibition layer, a photoconductive layer and a surface layer were formed in the named order on the cylindrical substrate, wherein as the photoconductive layer, a 2 μm thick second layer region was formed on the substrate side and a 28 μm thick first layer region was formed on the surface layer side.

In this way, there were prepared a plurality of light receiving members.

Figure 6B:
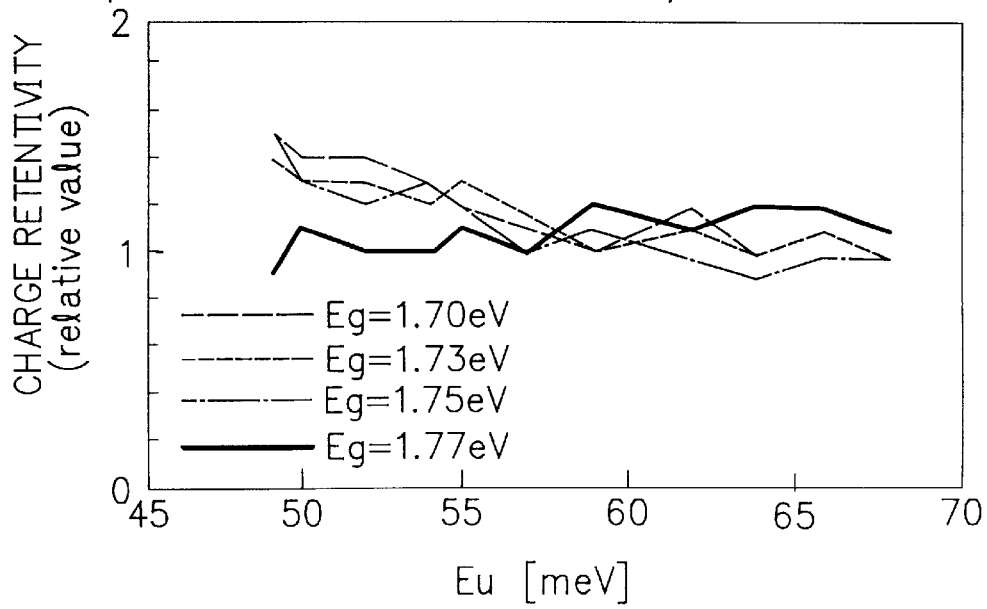
FIG. 6(B) is a graph showing interrelations between chracteristic energy (Eu) at Urback tail and charge retentivity for a given second layer region (of the photoconductive layer) positioned on the substrate side, which were obtained in the present invention.
Figure 7B:
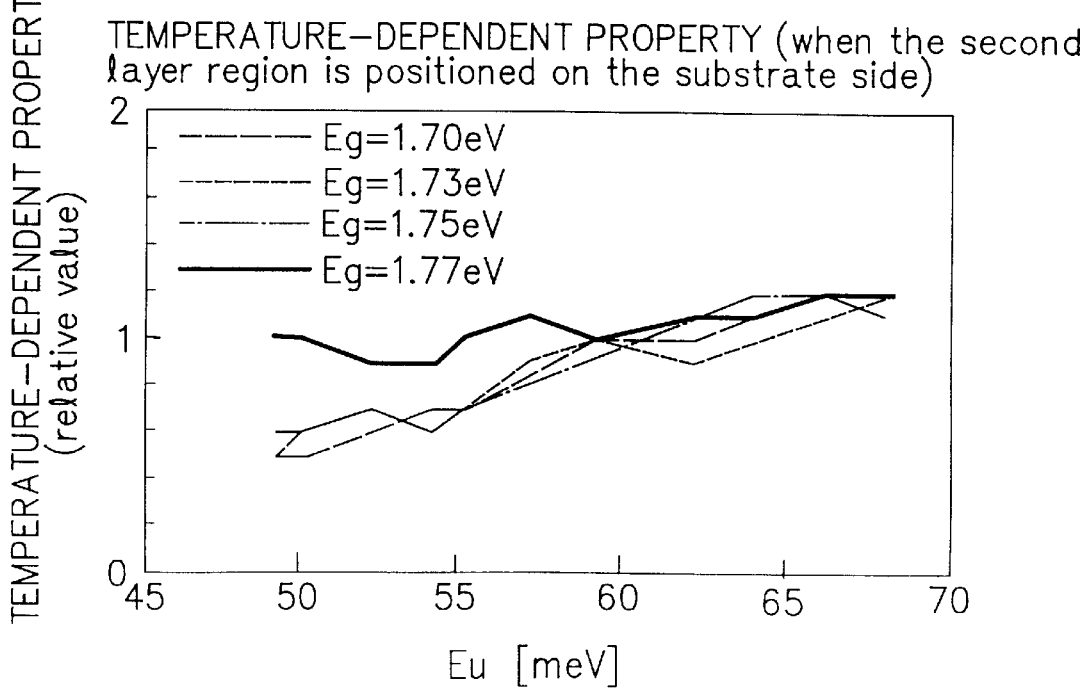
FIG. 7(B) is a graph showing interrelations between chracteristic energy (Eu) at Urback tail and temperature-dependent property for a given second layer region (of the photoconductive layer) positioned on the substrate side, which were obtained in the present invention.
Figure 8B:
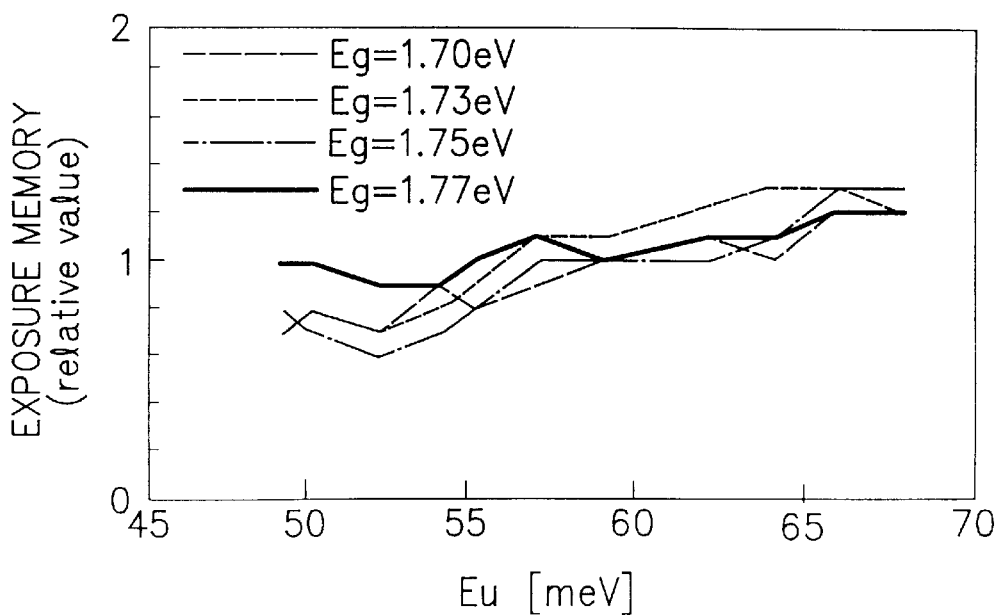
FIG. 8(B) is a graph showing interrelations between chracteristic energy (Eu) at Urback tail and exposure memory for a given second layer region (of the photoconductive layer) positioned on the substrate side, which were obtained in the present invention.

The light receiving members thus obtained were evaluated in the same evaluation manner described in the evaluation of Example 1. As for the evaluated results with respect to interrelations between different Eu values and charge retentivities, they are graphically shown in FIG. 6(B). As for the evaluated results with respect to interrelations between different Eu values and temperature-dependent properties, they are graphically shown in FIG. 7(B). As for the evaluated results with respect to interrelations between different Eu values and exposure memories, they are graphically shown in FIG. 8(B).

Separately, there were provided a plurality of cylindrical aluminum substrates of 60 mm in outer diameter having a mirror-finished surface, a plurality of cylindrical aluminum substrates of 40 mm in outer diameter having a mirror-finished surface, a plurality of cylindrical aluminum substrates of 30 mm in outer diameter having a mirror-finished surface, a plurality of cylindrical aluminum substrates of 25 mm in outer diameter having a mirror-finished surface, and a plurality of cylindrical aluminum substrates of 20 mm in outer diameter having a mirror-finished surface.

Using some of these cylindrical substrates, there were prepared a plurality of light receiving members in accordance with the above procedures for the preparation of a light receiving member except for forming no second layer region.

Using the remaining cylindrical substrates, there were prepared a plurality of light receiving members in accordance with the above procedures for the preparation of a light receiving member.

Figure 11:
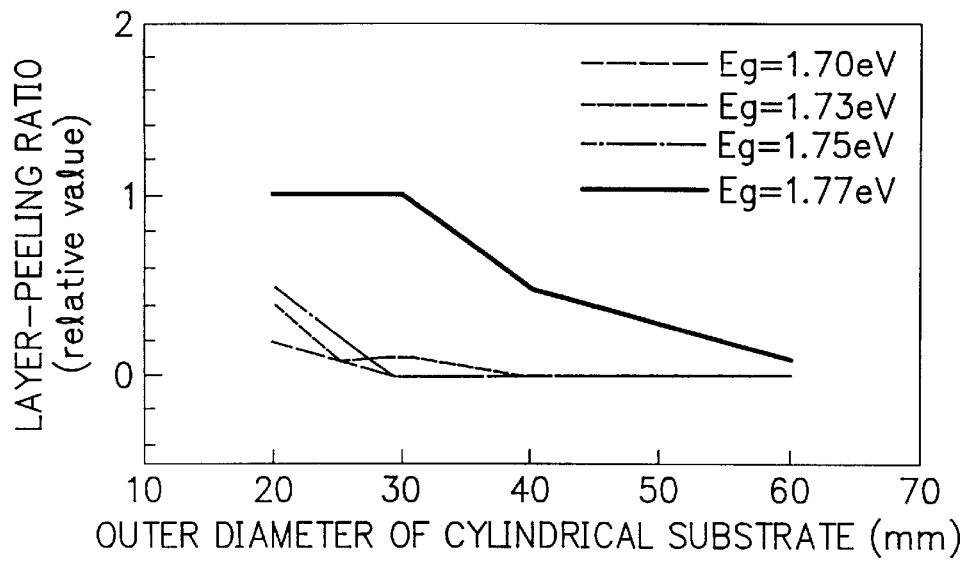
FIG. 11 is a graph showing interrelations between adhesion (based on layer peeling ratio) of a layered structure containing a given second layer region (of the photoconductive layer) positioned on the substrate side and the outer diameter of a cylindrical substrate used, which were obtained in the present invention.

For the resultant light receiving members, evaluation was conducted with respect to adhesion (occurrence of layer peeling) by a conventional manner. The evaluated results are graphically shown FIG. 11 in terms of the layer peeling ratio (the ratio of the presence or absence of layer peeling). Each of the values shown in FIG. 11 is a value relative to the corresponding layer peeling ratio of the light receiving member with no second layer region, which is set at 1.

In addition, these light receiving members were also evaluated in the same evaluation manner described in the evaluation of Example 1.

Based on the evaluated results obtained, there were obtained the following facts. Any of the light receiving members in which the photoconductive layer comprises the first layer region (situated on the surface layer side) and the specific second layer region (situated on the substrate side) having an optical band gap in the range of 1.65 to 1.75 eV and a characteristic energy (Eu) of the potential tail in the range of 45 to 55 meV is surpassing the light receiving members with no such second layer region with respect to charge retentivity, temperature-dependent property, exposure memory, and adhesion. However, with respect to temperature-dependent sensitivity and sensitivity linearity, there is not a distinguishable difference between the former and the latter.

EXAMPLE 3

There were provided a plurality of cylindrical aluminum substrates of 30 mm in outer diameter having a mirror-finished surface and a plurality of cylindrical aluminum substrates of 80 mm in outer diameter having a mirror-finished surface.

Each of these cylindrical substrate was positioned on the cylindrical substrate holder of the RF plasma CVD apparatus shown in FIG. 3. And in accordance with the procedures of Example 1 for the preparation of a light receiving member, a charge injection inhibition layer, a photoconductive layer and a surface layer were formed in the named order on the cylindrical substrate, wherein as the photoconductive layer, a second layer region, a first layer region and another second layer region were formed in this order on the charge injection inhibition layer. And the second layer region situated on the substrate side was made to have a thickness of 2 μm, and the another second layer region situated on the surface layer side was made to have a thickness capable of absorbing 80 to 95% of light with a wavelength of 680 nm as well as in Example 1.

In this way, there were prepared a plurality of light receiving members.

The light receiving members thus obtained were evaluated in the same evaluation manner described in the evaluation of Example 1.

Separately, there were provided a plurality of cylindrical aluminum substrates of 60 mm in outer diameter having a mirror-finished surface, a plurality of cylindrical aluminum substrates of 40 mm in outer diameter having a mirror-finished surface, a plurality of cylindrical aluminum substrates of 30 mm in outer diameter having a mirror-finished surface, a plurality of cylindrical aluminum substrates of 25 mm in outer diameter having a mirror-finished surface, and a plurality of cylindrical aluminum substrates of 20 mm in outer diameter having a mirror-finished surface.

Using some of these cylindrical substrates, there were prepared a plurality of light receiving members in accordance with the above procedures for the preparation of a light receiving member except for forming no second layer region.

Using the remaining cylindrical substrates, there were prepared a plurality of light receiving members in accordance with the above procedures for the preparation of a light receiving member.

For the resultant light receiving members, evaluation was conducted with respect to adhesion (occurrence of layer peeling) by a conventional manner.

For the resultant light receiving members, evaluation was conducted with respect to adhesion (occurrence of layer peeling) by a conventional manner.

In addition, these light receiving members were also evaluated in the same evaluation manner described in the evaluation of Example 1.

Based on the evaluated results obtained, there were obtained the following facts. Any of the light receiving members in which the photoconductive layer comprises the specific first layer region interposed between the two specific second layer regions having an optical band gap in the range of 1.65 to 1.75 eV and a characteristic energy (Eu) of the potential tail in the range of 45 to 55 meV is surpassing the light receiving members with no such second layer region with respect to temperature-dependent sensitivity, sensitivity linearity, charge retentivity, temperature-dependent property and exposure memory respectively for any of laser, LED ray and halogen lamp light, and adhesion. Particularly, the former has a marked improvement in the temperature-dependent sensitivity and sensitivity linearity for laser and LED ray. And the former provides a desirable image with no interference fringe pattern even in the case of using visible laser.

EXAMPLE 4

There was provided a cylindrical aluminum substrate of 80 mm in outer diameter having a mirror-finished surface.

The cylindrical substrate was positioned on the cylindrical substrate holder of the RF plasma CVD apparatus shown in FIG. 3. And in accordance with the foregoing film-forming manner using the RF plasma CVD apparatus shown in FIG. 3 and under film-forming conditions shown in Table 2, a charge injection inhibition layer, a photoconductive layer and a surface layer were formed in the named order on the cylindrical substrate, wherein as the photoconductive layer, a 25 μm thick first layer region was formed on the substrate side and a second layer region having a thickness capable of absorbing about 90% of light with a wavelength of 680 nm was formed on the surface layer side. By this, there was obtained a light receiving member.

The first layer region of the photoconductive layer of the resultant light receiving member was found to have a hydrogen content (Ch) of 20 atomic %, an optical band gap of 1.77 eV, and a characteristic energy (Eu) (of the potential tail) of 60 meV. And the second layer region was found to have a hydrogen content of 19 atomic %, an optical band gap of 1.73 eV, and a characteristic energy (Eu) of 52 meV.

Evaluation

The resultant light receiving member was set the foregoing electrophotographic apparatus NP 6550 produced by CANON Kabushiki Kaisha (modified for experimental purposes) in which the image exposure can be conducted by LED with a wavelength of 680 nm or by light from a halogen lamp, where evaluation was conducted with respect to potential characteristics in the same manner as in Example 1.

The evaluated results revealed that the light receiving member excels in temperature-dependent sensitivity, sensitivity linearity, charge retentivity, temperature-dependent property and exposure memory respectively for any of LED ray and halogen lamp light.

In addition, the image-forming performance of the light receiving member was evaluated by way of positive charging. As a result, the light receiving member found to provide a high quality image with neither exposure memory nor defect such as black or white dot or smeared image. Based on these facts, the light receiving member was found to excel in the electrophotographic characteristics required for an electrophotographic light receiving member.

Hence, it is understood that in the case of a light receiving member comprising a charge injection inhibition layer, a photoconductive layer and a surface layer stacked in the named order on a substrate, when the photoconductive layer is designed to have a two-layered structure comprising a first layer region and a second layer region stacked in this order from the charge injection inhibition layer side, said first layer region having a hydrogen content (Ch) of 15 to 25 atomic %, an optical band gap (Eg) of 1.75 to 1.80 eV, and a characteristic energy (Eu) of 55 to 65 meV and said second layer region having a hydrogen content (Ch) of 10 to 20 atomic %, an optical band gap (Eg) of 1.65 to 1.75 eV, and a characteristic energy (Eu) of 45 to 55 meV, the light receiving member excels in the electrophotographic characteristics required for an electrophotographic light receiving member.

EXAMPLE 5

There was provided a cylindrical aluminum substrate of 80 mm in outer diameter having a mirror-finished surface.

The cylindrical substrate was positioned on the cylindrical substrate holder of the RF plasma CVD apparatus shown in FIG. 3. And in accordance with the foregoing film-forming manner using the RF plasma CVD apparatus shown in FIG. 3 and under film-forming conditions shown in Table 3, a charge injection inhibition layer, a photoconductive layer and a surface layer were formed in the named order on the cylindrical substrate, wherein as the photoconductive layer, a 3 μm thick second layer region was formed on the substrate side and a 25 μm thick first layer region was formed on the surface layer side, and the surface layer was formed to contain silicon atoms and carbon atoms such that their concentration distributions are uneven in the layer thickness direction as shown in Table 3. By this, there was obtained a light receiving member.

The first layer region of the photoconductive layer of the resultant light receiving member was found to have a hydrogen content (Ch) of 18 atomic %, an optical band gap of 1.80 eV, and a characteristic energy (Eu) (of the potential tail) of 62 meV. And the second layer region was found to have a hydrogen content of 15 atomic %, an optical band gap of 1.70 eV, and a characteristic energy (Eu) of 52 meV.

Evaluation

The resultant light receiving member was evaluated in the same manner as in Example 4. It was also evaluated with respect to adhesion in the layered structure by a conventional manner.

The evaluated results revealed that the light receiving member excels in the electrophotographic characteristics required for an electrophotographic light receiving member when halogen lamp light is used for image exposure and it has satisfactory adhesion in the layered structure.

Hence, it is understood that in the case of a light receiving member comprising a charge injection inhibition layer, a photoconductive layer and a surface layer (containing silicon atoms and carbon atoms such that their concentration distributions are uneven in the layer thickness direction) stacked in the named order on a substrate, when the photoconductive layer is designed to have a two-layered structure comprising a second layer region and a first layer region stacked in this order from the charge injection inhibition layer side, said first layer region having a hydrogen content (Ch) of 15 to 25 atomic %, an optical band gap (Eg) of 1.75 to 1.80 eV, and a characteristic energy (Eu) of 55 to 65 meV and said second layer region having a hydrogen content (Ch) of 10 to 20 atomic %, an optical band gap (Eg) of 1.65 to 1.75 eV, and a characteristic energy (Eu) of 45 to 55 meV, the light receiving member excels in the electrophotographic characteristics required for an electrophotographic light receiving member.

EXAMPLE 6

There was provided a cylindrical aluminum substrate of 80 mm in outer diameter having a mirror-finished surface.

The cylindrical substrate was positioned on the cylindrical substrate holder of the RF plasma CVD apparatus shown in FIG. 3. And in accordance with the foregoing film-forming manner using the RF plasma CVD apparatus shown in FIG. 3 and under film-forming conditions shown in Table 4, a charge injection inhibition layer (containing silicon atoms (Si), hydrogen atoms (H), boron atoms (B), nitrogen atoms (N), carbon atoms (C) and oxygen atoms (O)), a photoconductive layer (containing Si, H, B, N, C, and O) and a surface layer (containing Si, H, B, N, C, and O) were formed in the named order on the cylindrical substrate, wherein as the photoconductive layer, a 20 um thick first layer region was formed on the substrate side and a second layer region having a thickness capable of absorbing about 85% of light with a wavelength of 680 nm was formed on the surface layer side, and the surface layer was formed to contain the Si and C such that their concentration distributions are uneven in the layer thickness direction as shown in Table 4. By this, there was obtained a light receiving member.

The first layer region of the photoconductive layer of the resultant light receiving member was found to have a hydrogen content (Ch) of 22 atomic %, an optical band gap of 1.79 eV, and a characteristic energy (Eu) (of the potential tail) of 64 meV. And the second layer region was found to have a hydrogen content of 12 atomic %, an optical band gap of 1.70 eV, and a characteristic energy (Eu) of 50 meV.

Evaluation

The resultant light receiving member was evaluated in the same manner as in Example 4.

The evaluated results revealed that the light receiving member excels in the electrophotographic characteristics required for an electrophotographic light receiving member when either LED ray or halogen lamp light is used for image exposure.

Hence, it is understood that in the case of a light receiving member comprising a charge injection inhibition layer (containing Si, H, B, N, C, and O), a photoconductive layer (containing Si, H, B, N, C, and O) and a surface layer (containing Si, H, B, N, C, and O and containing the Si and C such that their concentration distributions are uneven in the layer thickness direction) stacked in the named order on a substrate, when the photoconductive layer is designed to have a two-layered structure comprising a first layer region and a second layer region stacked in this order from the charge injection inhibition layer side, said first layer region having a hydrogen content (Ch) of 15 to 25 atomic %, an optical band gap (Eg) of 1.75 to 1.80 eV, and a characteristic energy (Eu) of 55 to 65 meV and said second layer region having a hydrogen content (Ch) of 10 to 20 atomic %, an optical band gap (Eg) of 1.65 to 1.75 eV, and a characteristic energy (Eu) of 45 to 55 meV, the light receiving member excels in the electrophotographic characteristics required for an electrophotographic light receiving member.

EXAMPLE 7

There was provided a cylindrical aluminum substrate of 80 mm in outer diameter having a mirror-finished surface.

The cylindrical substrate was positioned on the cylindrical substrate holder of the RF plasma CVD apparatus shown in FIG. 3. And in accordance with the foregoing film-forming manner using the RF plasma CVD apparatus shown in FIG. 3 and under film-forming conditions shown in Table 5, a charge injection inhibition layer, a photoconductive layer and a surface layer were formed in the named order on the cylindrical substrate, wherein as the photoconductive layer, a 25 μm thick first layer region was formed on the substrate side and a second layer region having a thickness capable of absorbing about 85% of light with a wavelength of 680 nm was formed on the surface layer side, the charge injection inhibition layer was formed to contain nitrogen and oxygen atoms such their concentration distributions are uneven in the layer thickness direction, and the surface layer was formed to contain silicon and carbon atoms such that their concentration distributions are uneven in the layer thickness direction. By this, there was obtained a light receiving member.

The first layer region of the photoconductive layer of the resultant light receiving member was found to have a hydrogen content (Ch) of 20 atomic %, an optical band gap of 1.78 eV, and a characteristic energy (Eu) (of the potential tail) of 60 meV. And the second layer region was found to have a hydrogen content of 18 atomic %, an optical band gap of 1.74 eV, and a characteristic energy (Eu) of 54 meV.

Evaluation

The resultant light receiving member was evaluated in the same manner as in Example 4. It was also evaluated with respect to adhesion in the layered structure by a conventional manner.

The evaluated results revealed that the light receiving member excels in the electrophotographic characteristics required for an electrophotographic light receiving member when either LED ray or halogen lamp light is used for image exposure and it has satisfactory adhesion in the layered structure.

Hence, it is understood that in the case of a light receiving member comprising a charge injection inhibition layer, a photoconductive layer and a surface layer (containing silicon atoms and carbon atoms such that their concentration distributions are uneven in the layer thickness direction) stacked in the named order on a substrate, when the photoconductive layer is designed to have a two-layered structure comprising a second layer region and a first layer region stacked in this order from the charge injection inhibition layer side, said first layer region having a hydrogen content (Ch) of 15 to 25 atomic %, an optical band gap (Eg) of 1.75 to 1.80 eV, and a characteristic energy (Eu) of 55 to 65 meV and said second layer region having a hydrogen content (Ch) of 10 to 20 atomic %, an optical band gap (Eg) of 1.65 to 1.75 eV, and a characteristic energy (Eu) of 45 to 55 meV, the light receiving member excels in the electrophotographic characteristics required for an electrophotographic light receiving member.

EXAMPLE 8

There was provided a cylindrical aluminum substrate of 80 mm in outer diameter having a mirror-finished surface.

The cylindrical substrate was positioned on the cylindrical substrate holder of the RF plasma CVD apparatus shown in FIG. 3. And in accordance with the foregoing film-forming manner using the RF plasma CVD apparatus shown in FIG. 3 and under film-forming conditions shown in Table 6, a charge injection inhibition layer, a photoconductive layer and a surface layer were formed in the named order on the cylindrical substrate, wherein the photoconductive layer was formed to have a three-layered structure comprising a 2 μm thick second layer region, a 25 μm thick first layer region and another second layer region having a thickness capable of absorbing about 95% of light with a wavelength of 680 nm stacked in this order from the charge injection inhibition layer side, and the surface layer was formed to contain silicon and carbon atoms such that their concentration distributions are uneven in the layer thickness direction. By this, there was obtained a light receiving member.

The first layer region of the photoconductive layer of the resultant light receiving member was found to have a hydrogen content (Ch) of 23 atomic %, an optical band gap of 1.80 eV, and a characteristic energy (Eu) (of the potential tail) of 65 meV. And each of the two second layer regions was found to have a hydrogen content of 14 atomic %, an optical band gap of 1.71 eV, and a characteristic energy (Eu) of 53 meV.

Evaluation

The resultant light receiving member was evaluated in the same manner as in Example 4. It was also evaluated with respect to adhesion in the layered structure by a conventional manner.

The evaluated results revealed that the light receiving member excels in the electrophotographic characteristics required for an electrophotographic light receiving member when either LED ray or halogen lamp light is used for image exposure and it has satisfactory adhesion in the layered structure.

Hence, it is understood that in the case of a light receiving member comprising a charge injection inhibition layer, a photoconductive layer and a surface layer (containing silicon atoms and carbon atoms such that their concentration distributions are uneven in the layer thickness direction) stacked in the named order on a substrate, when the photoconductive layer is designed to have a three-layered structure comprising a second layer region, a first layer region and another second layer region stacked in this order from the charge injection inhibition layer side, said first layer region having a hydrogen content (Ch) of 15 to 25 atomic %, an optical band gap (Eg) of 1.75 to 1.80 eV, and a characteristic energy (Eu) of 55 to 65 meV and each of said two second layer regions having a hydrogen content (Ch) of 10 to 20 atomic %, an optical band gap (Eg) of 1.65 to 1.75 eV, and a characteristic energy (Eu) of 45 to 55 meV, the light receiving member excels in the electrophotographic characteristics required for an electrophotographic light receiving member.

EXAMPLE 9

The light receiving member-preparing procedures of each of Examples 4, 6, 7 and 8 were repeated, except that the cylindrical aluminum substrate of 80 mm in outer diameter was replaced by a cylindrical aluminum substrate of 30 mm in outer diameter having a mirror-finished surface, to obtain four light receiving members.

For each of the resultant four light receiving member, the light receiving member was set to the foregoing electrophotographic apparatus GP 55 produced by CANON Kabushiki Kaisha (modified for experimental purposes), where copying shot was conducted 100,000 times in an environment with temperature changes. As a result, it was found that each of the four light receiving members stably and continuously reproduces a high quality image with neither uneven image density not interference fringe pattern under such severe environment. And the four light receiving member thus endured was found to be free of layer peeling.

Hence, it is understood that when the photoconductive layer of a light receiving member is constituted by a specific first layer region disposed on the substrate side and a specific second layer region disposed on the surface side, said first layer region having a hydrogen content (Ch) of 15 to 25 atomic %, an optical band gap (Eg) of 1.75 to 1.80 eV, and a characteristic energy (Eu) of 55 to 65 meV and said second layer region having a hydrogen content (Ch) of 10 to 20 atomic %, an optical band gap (Eg) of 1.65 to 1.75 eV, and a characteristic energy (Eu) of 45 to 55 meV, there can be attained a desirable light receiving member which stably and continuously reproduces a high quality image with neither uneven image density not interference fringe pattern in severe environment even in the case of using visible laser.

As apparent from the above description, the present invention provides such advantages as will be described below.

As previously described, the light receiving member according to the present invention is characterized in that the photoconductive layer comprises the specific first and second layer regions being stacked. Because of this, the light receiving member according to the present invention is free of various problems found in the conventional light receiving members (constituted by an a-Si material) for use in electrophotography and it has markedly improved electric, optical and photoconductive properties and markedly improved image-forming properties. In addition to these advantages, it also have markedly improved durability and use environmental characteristics. Particularly, in the present invention, by dividing the photoconductive layer to have at least two layer regions which are different from each other with respect to optical band gap and gap state, more particularly by specifying a light incident region of the photoconductive layer, there can be attained a desirable light receiving member which minimizes the temperature dependency (e.g., gradient, curving or the like) of sensitivity linearity against laser having a long wavelength or LED ray used in digital systems and is high enough in charge retentivity and which prevents the surface potential from varying due to a change in the environment, exhibits markedly improved potential characteristics and markedly improved image-forming characteristics.

Further, according to the present invention, there can be attained a desirable light receiving member which has a marked improvement in the temperature-dependent sensitivity, sensitivity linearity and temperature-dependent charge retentivity in a use environment with temperature changes while substantially preventing the occurrence of an exposure memory, which also has an improved adhesion in the layered structure while having an improved stability against the use environment, and which excels in halftone reproduction and stably and continuously reproduces a high quality image excelling in resolution.

TABLE 1

|  | charge injection inhibition layer | photoconductive layer | | surface layer |
|---|---|---|---|---|
|  |  | first layer region | second layer region |  |
| gas used and its flow rate |  |  |  |  |
| $SiH_4$ [SCCM] | 200 | 200 | 100 | 10 |
| $H_2$ [SCCM] | 300 | 1000 | 800 |  |
| $B_2H_6$ [ppm] (against $SiH_4$) | 2000 | 2 | 0.2 |  |
| NO [SCCM] | 5 |  |  |  |
| $CH_4$ [SCCM] |  |  |  | 500 |
| substrate temperature [°C.] | 290 | 290 | 280 | 280 |
| inner pressure [Torr] | 0.5 | 0.5 | 0.5 | 0.5 |
| RF power [W] | 500 | 800 | 100 | 200 |
| thickness [μm] | 3 | 28 | * | 0.5 |

*formed to have a thickness capable of absorbing 80 to 95% of light with a wavelength of 680 nm.

TABLE 2

| | charge injection inhibition layer | photoconductive layer first layer region | photoconductive layer second layer region | surface layer |
|---|---|---|---|---|
| gas used and its flow rate | | | | |
| SiH$_4$ [SCCM] | 150 | 150 | 100 | 10 |
| H$_2$ [SCCM] | 300 | 800 | 1000 | |
| B$_2$H$_6$ [ppm] (against SiH$_4$) | 2000 | 2 | 0.5 | |
| NO [SCCM] | 5 | | | |
| CH$_4$ [SCCM] | | | | 500 |
| substrate temperature [°C.] | 260 | 260 | 260 | 260 |
| inner pressure [Torr] | 0.4 | 0.5 | 0.5 | 0.3 |
| RF power [W] | 300 | 600 | 150 | 200 |
| thickness [μm] | 3 | 25 | * | 0.5 |

*formed to have a thickness capable of absorbing about 90% of light with a wavelength of 680 nm.

TABLE 3

| | charge injection inhibition layer | photoconductive layer first layer region | photoconductive layer second layer region | surface layer |
|---|---|---|---|---|
| gas used and its flow rate | | | | |
| SiH$_4$ [SCCM] | 150 | 100 | 200 | 200→20→20 |
| H$_2$ [SCCM] | 300 | 800 | 1000 | |
| B$_2$H$_6$ [ppm] (against SiH$_4$) | 2000 | 0.5 | 2 | |
| NO [SCCM] | 5 | | | |
| CH$_4$ [SCCM] | | | | 50→600→600 |
| substrate temperature [°C.] | 280 | 280 | 280 | 280 |
| inner pressure [Torr] | 0.4 | 0.5 | 0.5 | 0.5 |
| RF power [W] | 300 | 100 | 600 | 150 |
| thickness [μm] | 3 | 3 | 25 | 0.5 |

TABLE 4

| | charge injection inhibition layer | photoconductive layer first layer region | photoconductive layer second layer region | surface layer |
|---|---|---|---|---|
| gas used and its flow rate | | | | |
| SiH$_4$ [SCCM] | 150 | 150 | 50 | 200→10→10 |
| SiF$_4$ [SCCM] | 5 | 1 | 1 | 5 |
| H$_2$ [SCCM] | 500 | 600 | 400 | |
| B$_2$H$_6$ [ppm] (against SiH$_4$) | 1500 | 2 | 0.7 | 1 |
| NO [SCCM] | 10 | 0.1 | 0.1 | 0.5 |
| CH$_4$ [SCCM] | 5 | 0.2 | 0.2 | 50→600→700 |
| substrate temperature [°C.] | 270 | 260 | 260 | 250 |
| inner pressure [Torr] | 0.3 | 0.4 | 0.4 | 0.4 |
| RF power [W] | 200 | 600 | 100 | 100 |
| thickness [μm] | 3 | 20 | * | 0.5 |

*formed to have a thickness capable of absorbing about 85% of light with a wavelength of 680 nm.

TABLE 5

| | charge injection inhibition layer | photoconductive layer first layer region | photoconductive layer second layer region | surface layer |
|---|---|---|---|---|
| gas used and its flow rate | | | | |
| SiH$_4$ [SCCM] | 150 | 150 | 75 | 150→15→10 |
| GeH$_4$ [SCCM] | | | | |
| H$_2$ [SCCM] | 200 | 800 | 800 | |
| B$_2$H$_6$ [ppm] (against SiH$_4$) | 2000 | 0.5 | 0.1 | |
| NO [SCCM] | 10→0 | | | |
| CH$_4$ [SCCM] | | | | 0→500→600 |
| substrate temperature [°C.] | 260 | 260 | 260 | 260 |
| inner pressure [Torr] | 0.4 | 0.4 | 0.4 | 0.4 |
| RF power [W] | 150 | 600 | 75 | 200 |
| thickness [μm] | 3 | 25 | * | 0.7 |

*formed to have a thickness capable of absorbing about 85% of light with a wavelength of 680 nm.

TABLE 6

| | charge injection inhibition layer | photoconductive layer second layer region | photoconductive layer first layer region | photoconductive layer second layer region | surface layer |
|---|---|---|---|---|---|
| gas used and its flow rate | | | | | |
| SiH$_4$ [SCCM] | 100 | 100 | 100 | 100 | 200→10 |
| H$_2$ [SCCM] | 300 | 800 | 400 | 800 | |
| B$_2$H$_6$ [ppm] (against SiH$_4$) | 1500 | 1 | 2 | 0.15 | |
| NO [SCCM] | 10 | | | | |
| CH$_4$ [SCCM] | | | | | 10→600 |
| substrate temperature [°C.] | 300 | 280 | 300 | 280 | 300 |
| inner pressure [Torr] | 0.4 | 0.5 | 0.5 | 0.5 | 0.4 |
| RF power [W] | 200 | 100 | 400 | 100 | 150 |
| thickness [μm] | 3 | 2 | 25 | * | 0.5 |

*formed to have a thickness of absorbing about 95% of light with a wavelength of 680 nm.

What is claimed is:

1. A light receiving member capable of imagewise exposure by semiconductor laser or light-emitting diode irradiation comprising a photoconductive layer constituted by a non-single crystal material containing silicon atoms as a matrix and at least one kind of atoms selected from the group consisting of hydrogen atoms and halogen atoms, wherein said photoconductive layer contains a first layer region and a second layer region which are different from each other with respect to (a) characteristic energy at an exponential tail obtained from a light absorption spectrum, (b) hydrogen content and (c) optical band gap, said first layer region and said second layer region being stacked, said first layer region being of 55 to 65 meV in the characteristic energy (a), 15 to 25 atomic % in the hydrogen content (b), and 1.75 to 1.80 eV in the optical band gap (c); and said second layer region being of 45 to 55 meV in the characteristic energy (a), 10 to 20 atomic % in the hydrogen content (b), and 1.65 to 1.75 eV in the optical band gap (c).

2. A light receiving member according to claim 1, wherein the second layer region has a layer thickness corresponding to 3 to 50% versus the total layer thickness of the photoconductive layer.

3. A light receiving member according to claim 1, wherein the photoconductive layer contains the first layer region formed on an electrically conductive surface of a substrate and the second layer region stacked on the first layer region.

4. A light receiving member according to claim 1, wherein the photoconductive layer contains the second layer region formed on an electrically conductive surface of a substrate and the first layer region stacked on the second layer region.

5. A light receiving member according to claim 1, wherein the second layer region comprises two layer regions, wherein one of said two layer regions is formed on an electrically conductive surface of a substrate, the first layer region is stacked on said layer region formed on said electrically conductive surface of said substrate, and the remaining layer region of the second layer region is stacked on the first layer region.

6. A light receiving member according to claim 1, wherein the second layer region is stacked on the front side of the first layer region at a thickness sufficient to provide [that provides a] an absorption factor of 80 to 95% for the wavelength of the semiconductor laser or the light-emitting diode, said semiconductor laser or light-emitting diode having a long wavelength of visible light region.

7. A light receiving member according to claim 1, wherein the photoconductive layer contains atoms of at least an element belonging to group IIIb or Vb of the periodic table therein.

8. A light receiving member according to claim 1, wherein the photoconductive layer contains at least one kind of atoms selected from the group consisting of carbon atoms, oxygen atoms and nitrogen atoms.

9. A light receiving member according to claim 1 which further comprises a surface layer disposed on the photoconductive layer, said surface layer being constituted by a silicon-containing non-single crystal material containing at least one kind of atoms selected from the group consisting of carbon atoms, oxygen atoms and nitrogen atoms.

10. A light receiving member according to claim 9 which further comprises a charge injection inhibition layer disposed on the rear side of the photoconductive layer, said charge injection inhibition layer being constituted by a non-single crystal material containing silicon atoms as a matrix, at least one kind of atoms selected from the group consisting of carbon atoms, oxygen atoms and nitrogen atoms, and atoms of at least an element belonging to group IIIb or Vb of the periodic table.

11. A light receiving member according to claim 9, wherein the surface layer has a thickness of 0.01 to 3 $\mu$m.

12. A light receiving member according to claim 10, wherein the charge injection inhibition layer has a thickness of 0.1 to 5 $\mu$m.

13. A light receiving member according to claim 1, rein the photoconductive layer has a thickness of 20 to $\mu$m.

* * * * *

UNITED STATES PATENT AND TRADEMARK OFFICE
CERTIFICATE OF CORRECTION

PATENT NO. : 5,839,230
DATED : NOVEMBER 24, 1998
INVENTOR(S) : MICHAEL A. LICKING ET AL.

It is certified that error appears in the above-identified patent and that said Letters Patent is hereby corrected as shown below:

Col. 17, line 65, delete "into a force", insert --into a lifting force--

Col. 19, lines 3-4, delete "attachment opposite", insert --attachment at opposite--

Col. 19, line 12, delete "claim 1", insert --claim 7--

Signed and Sealed this

Seventh Day of September, 1999

Attest:

Q. TODD DICKINSON

Attesting Officer    Acting Commissioner of Patents and Trademarks

UNITED STATES PATENT AND TRADEMARK OFFICE
CERTIFICATE OF CORRECTION

PATENT NO. : 5,939,230
DATED : August 17, 1999
INVENTOR(S) : SATOSHI KOJIMA ET AL.

Page 1 of 5

It is certified that error appears in the above-identified patent and that said Letters Patent is hereby corrected as shown below:

IN THE DRAWINGS
SHEET 9

Figure 12:
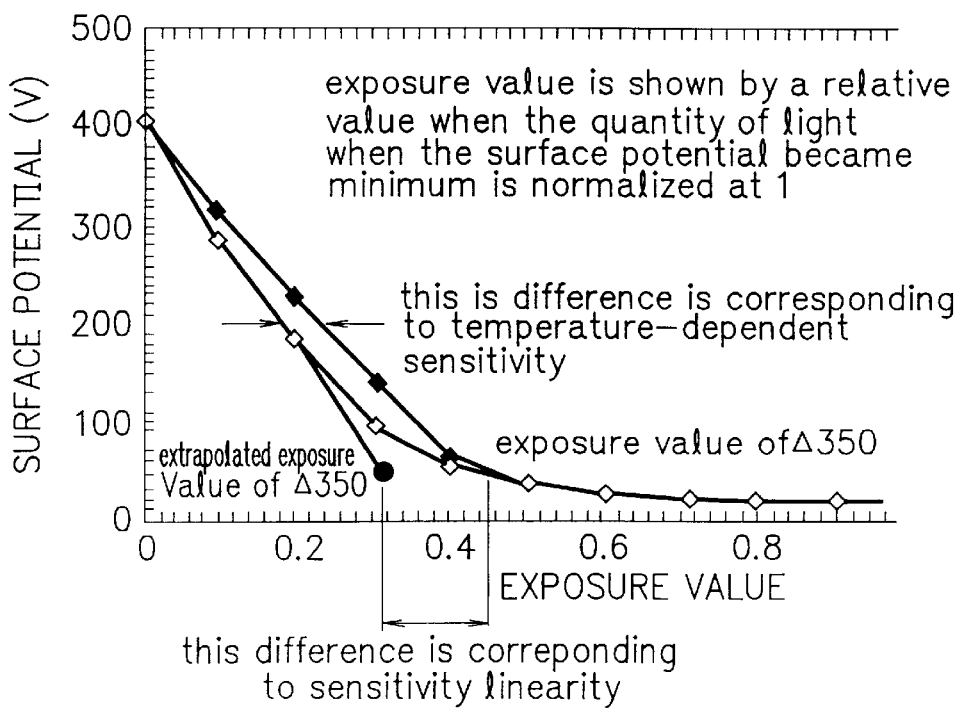
FIG. 12 is a graph for explaining the temperature-dependent sensitivity and sensitivity linearity in the present invention.

FIG. 12, "this is difference is corresponding" should read --this difference is corresponding--.

COLUMN 1

Line 7, "sence" should read --sense--;
Line 8, "y-rays)." should read --γ-rays).

COLUMN 2

Line 19, "of" (2nd occurrence) should be deleted.

COLUMN 3

Line 7, "so" (2nd occurrence) should be deleted;
Line 10, "Recent years," should read --In recent years,--; and "using" should read --used--;
Line 16, "pay" should read --play--;
Line 57, "tiviy" should read --tivity--.

COLUMN 4

Line 49, "a" should be deleted;
Line 65, "improves" should read --improved--.

COLUMN 5

Line 7, "improves" should read --improved--;
Line 30, "has" should be deleted--;
Line 55, "chra-" should read --chara---;
Line 61, "chra-" should read --chara---;
Line 66, "characteristic" should read --characteristic--.

UNITED STATES PATENT AND TRADEMARK OFFICE
CERTIFICATE OF CORRECTION

PATENT NO. : 5,939,230
DATED : August 17, 1999
INVENTOR(S) : SATOSHI KOJIMA ET AL.

It is certified that error appears in the above-identified patent and that said Letters Patent is hereby corrected as shown below:

COLUMN 6

Line 5, "characteristic" should read --characteristic--;
Line 10, "characteristic" should read --characteristic--;
Line 15, "characteristic" should read --characteristic--;
Line 20, "characteristic" should read --characteristic--;
Line 26, "characteristic" should read --characteristic--.

COLUMN 7

Line 63, "a" should read --an--.

COLUMN 8

Line 1, "later" should read --layer--;
Line 45, "coefficient$\alpha$" should read --coefficient $\alpha$--.

COLUMN 9

Line 12, "a-si" should read --a-Si--.

COLUMN 10

Line 16, "an" should read --a--;
Line 45, "mobilzes" should read --mobilizes--.

COLUMN 11

Line 43, "absorbing" should read --absorb--;
Line 60, "reproduces" should read --reproduce--.

COLUMN 13

Line 53, "smaller the" should read --smaller than the--.

UNITED STATES PATENT AND TRADEMARK OFFICE
CERTIFICATE OF CORRECTION

PATENT NO. : 5,939,230
DATED : August 17, 1999
INVENTOR(S) : SATOSHI KOJIMA ET AL.

It is certified that error appears in the above-identified patent and that said Letters Patent is hereby corrected as shown below:

COLUMN 14

Line 5, "D.C" should read --D.C.--.

COLUMN 15

Line 42, "(this" should read --(these--;
Line 45, "1 x $2^2$" should read --1 x $10^2$--.

COLUMN 16

Line 6, "PH" should read --$PH_3$,--.

COLUMN 17

Line 28, "obtain" should read --obtained--;
Line 54, "1.333 x 10'" should read --1.333 x $10^{-1}$--.

COLUMN 18

Line 63. "D.C." should read --D.C.--.

COLUMN 20

Line 44, "atomic 0%," should read --atomic %,--.

COLUMN 21

Line 28, "gases be" should read --gases may be--;
Line 39, "example" should read --examples--;
Line 58, "capable" should read --capable of--.

COLUMN 22

Line 15, "(this" should read --(these--;
Line 36, "$B_2$ $H_6$," should read --$B_2H_6$,--.

UNITED STATES PATENT AND TRADEMARK OFFICE
CERTIFICATE OF CORRECTION

PATENT NO. : 5,939,230
DATED : August 17, 1999
INVENTOR(S) : SATOSHI KOJIMA ET AL.

It is certified that error appears in the above-identified patent and that said Letters Patent is hereby corrected as shown below:

COLUMN 24

Line 62, "(this" should read --(these--.

COLUMN 25

Line 1, "to" (2nd occurrence) should be deleted;
Line 9, "(this" should read --these--;
Line 24, "prferably" should read --preferably--;
Line 31, "injection" (2nd occurrence) should read --inhibition--.

COLUMN 28

Line 52, "1 um" should read --1 $\mu$m--.

COLUMN 30

Line 19, "extraporated" should read --extrapolated--;
Line 24, "electrophographic" should read --electrophotographic--.

COLUMN 37

Line 58, "not" should read --nor--.

COLUMN 38

Line 5, "not" should read --nor--;
Line 21, "have" should read --has--.

COLUMN 40

Table 6, "thickness of" should read --thickness capable of--.

UNITED STATES PATENT AND TRADEMARK OFFICE
CERTIFICATE OF CORRECTION

PATENT NO. : 5,939,230
DATED : August 17, 1999
INVENTOR(S) : SATOSHI KOJIMA ET AL.

It is certified that error appears in the above-identified patent and that said Letters Patent is hereby corrected as shown below:

COLUMN 41

Line 18, "[that provides" should be deleted;
Line 19, "a]" should be deleted.

COLUMN 42

Line 24, "rein" should read --wherein--;
Line 25, "20 to µm." should read -- 29 to 50 µm.--.

Signed and Sealed this

Thirteenth Day of June, 2000

Attest:

Attesting Officer

Q. TODD DICKINSON
Director of Patents and Trademarks